(12) United States Patent
Safira et al.

(10) Patent No.: US 11,954,411 B2
(45) Date of Patent: Apr. 9, 2024

(54) HIGH FIDELITY SIMULATIONS FOR AUTONOMOUS VEHICLES BASED ON RETRO-REFLECTION METROLOGY

(71) Applicant: Waymo LLC, Mountain View, CA (US)

(72) Inventors: Arthur Dov Safira, Los Altos, CA (US); Harrison Lee McKenzie Chapter, Santa Clara, CA (US); Colin Andrew Braley, Mountain View, CA (US); Hui Seong Son, Hayward, CA (US); Aleksandar Rumenov Gabrovski, Mountain View, CA (US); Brian Choung Choi, Sunnyvale, CA (US)

(73) Assignee: Waymo LLC, Mountain View, CA (US)

( * ) Notice: Subject to any disclaimer, the term of this patent is extended or adjusted under 35 U.S.C. 154(b) by 684 days.

(21) Appl. No.: 16/947,926

(22) Filed: Aug. 24, 2020

(65) Prior Publication Data

US 2022/0058309 A1 Feb. 24, 2022

(51) Int. Cl.
*G06F 30/20* (2020.01)
*B60W 50/00* (2006.01)
(Continued)

(52) U.S. Cl.
CPC .............. *G06F 30/20* (2020.01); *B60W 50/00* (2013.01); *B60W 60/001* (2020.02); *G01S 17/10* (2013.01);
(Continued)

(58) Field of Classification Search
CPC ..... G06F 30/20; B60W 60/001; B60W 50/00; B60W 2050/0004; G01S 17/10; G01S 17/89; B06W 2050/0019
See application file for complete search history.

(56) References Cited

U.S. PATENT DOCUMENTS 11,275,673 B1 * 3/2022 Dolan ................. G06F 11/3664
2009/0306880 A1 12/2009 Gomi et al.
(Continued)

FOREIGN PATENT DOCUMENTS

JP 2014108711 A 6/2014

OTHER PUBLICATIONS

International Search Report and Written Opinion dated Nov. 29, 2021, on application No. PCT/ US2021/047199.
(Continued)

*Primary Examiner* — Chuen-Meei Gan
(74) *Attorney, Agent, or Firm* — Lowenstein Sandler LLP

(57) ABSTRACT

Aspects and implementations of the present disclosure address shortcomings of existing technology by enabling autonomous vehicle simulations based on retro-reflection optical data. The subject matter of this specification can be implemented in, among other things, a method that involves initiating a simulation of an environment of an autonomous driving vehicle, the simulation including a plurality of simulated objects, each having an identification of a material type of the respective object. The method can further involve accessing simulated reflection data based on the plurality of simulated objects and retro-reflectivity data for the material types of the simulated objects, and determining, using an autonomous vehicle control system for the autonomous vehicle, a driving path relative to the simulated objects, the driving path based on the simulated reflection data.

18 Claims, 7 Drawing Sheets

(51) Int. Cl.
*B60W 60/00* (2020.01)
*G01S 17/10* (2020.01)
*G01S 17/89* (2020.01)

(52) U.S. Cl.
CPC ...... *G01S 17/89* (2013.01); *B60W 2050/0004* (2013.01); *B60W 2050/0019* (2013.01)

(56) References Cited

U.S. PATENT DOCUMENTS

| | | | |
|---|---|---|---|
| 2017/0307732 A1 | 10/2017 | Haghighi et al. | |
| 2018/0060725 A1* | 3/2018 | Groh | G06N 3/045 |
| 2019/0302801 A1 | 10/2019 | Zlot et al. | |
| 2021/0097147 A1* | 4/2021 | DeVore | G06F 30/20 |
| 2021/0150230 A1* | 5/2021 | Smolyanskiy | G06V 20/56 |

OTHER PUBLICATIONS

Fadaie, Joshua G., "The State of Modeling, Simulation, and Data Utilization within Industry: An Automomous Vehicles Perspective", Computer Science, Computers and Society, arXiv: 1910.06075v1, Oct. 7, 2019, 66 pages.

Yang, Jing et al., "Distance and Velocity Measurement of Coherent Lidar Based on Chirp Pulse Compression", Sensors 2019, 19, 2313;doi:10.3390/s19102313, www.mdpi.com/journal sensors, published May 20, 2019, 10 pages.

* cited by examiner

US 11,954,411 B2

HIGH FIDELITY SIMULATIONS FOR AUTONOMOUS VEHICLES BASED ON RETRO-REFLECTION METROLOGY

TECHNICAL FIELD

The instant specification generally relates to autonomous vehicles. More specifically, the instant specification relates to improving autonomous driving systems and components using processing of simulated optical data generated based on retro-reflection measurements of physical objects.

BACKGROUND

Autonomous (fully and partially self-driving) vehicles operate by sensing an outside environment with various electromagnetic (e.g., radar and optical) and non-electromagnetic (e.g., audio and humidity) sensors. Some autonomous vehicles chart a driving path through the environment based on the sensed data. The driving path can be determined based on Global Positioning System (GPS) data and road map data. While the GPS and the road map data can provide information about static aspects of the environment (buildings, street layouts, road closures, etc.), dynamic information (such as information about other vehicles, pedestrians, street lights, etc.) is obtained from contemporaneously collected sensing data. Precision and safety of the driving path and of the speed regime selected by the autonomous vehicle depend significantly on the accuracy and completeness of the sensing data and on the ability of a driving algorithm to process the sensing data quickly and efficiently and to output correct instructions to the vehicle controls and the drivetrain.

BRIEF DESCRIPTION OF THE DRAWINGS

The present disclosure is illustrated by way of examples, and not by way of limitation, and can be more fully understood with references to the following detailed description when considered in connection with the figures, in which.

SUMMARY

Figure 1:
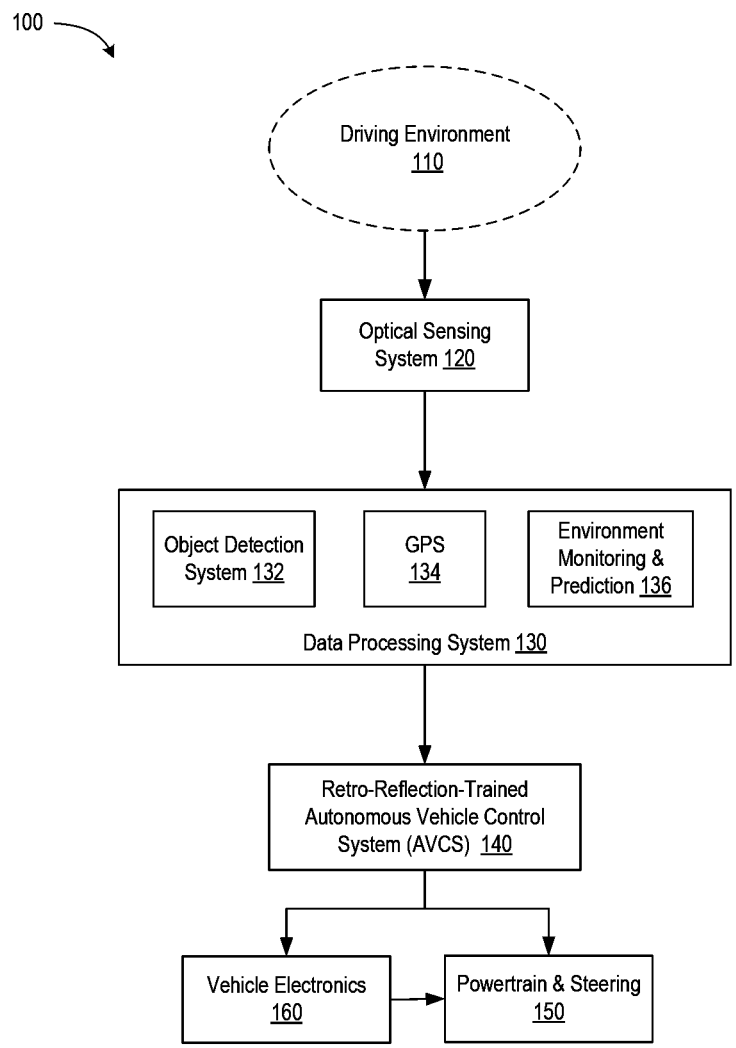
FIG. 1 is a diagram illustrating components of an example autonomous vehicle that uses electromagnetic sensing and an autonomous driving system trained using retro-reflection data, in accordance with some implementation of the present disclosure.

In one implementation, disclosed is a method of generating, using a computing device, a simulation of an environment around an autonomous vehicle, wherein the simulation includes representations of one or more objects based on retro-reflectivity data collected using test sensors. The method further includes generating a representation of the autonomous vehicle driving in the simulation and generating, based on the representations of the one or more objects, simulated reflection data for a first location associated with the representation of the autonomous vehicle at a first instance of time relative to the one or more objects. The method further includes adjusting the simulated reflection data based on a motion of the representation of the autonomous vehicle between the first location and a second location associated with the representation of the autonomous vehicle at a second instance of time relative to the one or more objects.

In another implementation, disclosed is a method of initiating, by a computing device, a simulation of an environment of an autonomous driving vehicle, wherein the simulation comprises a plurality of simulated objects, each of the plurality of simulated objects having a description comprising an identification of a material type of a respective simulated object. The method further includes accessing simulated reflection data, wherein the simulated reflection data is based on the plurality of simulated objects and retro-reflectivity data for one or more material types of the plurality of simulated objects, and determining, using an autonomous vehicle control system for an autonomous vehicle, a driving path relative to the plurality of simulated objects, wherein the driving path is based on the simulated reflection data.

In another implementation, disclosed is a system that includes a memory that stores instructions and a computing device to execute the instructions from the memory to: initiate a simulation of an environment of an autonomous driving vehicle, wherein the simulation comprises a plurality of simulated objects, each of the plurality of simulated objects having a description comprising an identification of a material type of the respective simulated object. The computing device is further to access simulated reflection data, wherein the simulated reflection data is based on the plurality of simulated objects and retro-reflectivity data for one or more material types of the plurality of simulated objects, and determine, using an autonomous vehicle control system for an autonomous vehicle, a driving path relative to the plurality of simulated objects, wherein the driving path is based on the simulated reflection data.

DETAILED DESCRIPTION

An autonomous vehicle can employ a light detection and ranging (LiDAR) technology to detect distances to various objects in the environment and sometimes the velocities of such objects. A LiDAR emits one or more laser signals (pulses) that travel to an object and detects arrived signals reflected back (retro-reflected) from the object. By determining a time delay between the signal emission and the arrival of the retro-reflected waves, a time-of-flight LiDAR can determine a distance to the object. Furthermore, some LiDARs can determine the velocity (speed and direction of motion) of the object by emitting two or more signals in a quick succession and detecting a changing position of the object with each additional signal. The intervals between successive signals can be short enough so that in the meantime the object does not change its position appreciably in relation to other objects of the environment, but still long enough to allow the LiDAR to accurately detect small changes in the object's position.

Reflectivity (including retro-reflectivity) data identifying the reflectivity of an object can be used in numerous autonomous vehicle applications or in simulations related to autonomous vehicles. For example, reflectivity data can be used to calibrate a LiDAR system, so that the reflectivity of an object detected by a LiDAR system can be used to accurately classify the object. As another example, an autonomous vehicle control system can use reflectivity data about objects in a geofenced area, in an operational design domain (ODD) in which the vehicle operates, or in an environmental condition that the vehicle encounters to select a certain LiDAR, type of LiDAR, and/or LiDAR configuration (e.g., LiDAR transmission power level, LiDAR shot schedule, or LiDAR shot distribution) to use in that area, ODD, or environmental condition. Some reflectivity data can be available for some physical objects in various databases of material parameters.

In real-life driving operations, an autonomous vehicle can encounter a large number of various objects and material types. Safety and efficiency of the autonomous vehicle operations, therefore, depend upon exposing the autonomous driving system and algorithms to as many types of objects and environments as possible, testing the responses of the autonomous driving system in such environments, and improving the autonomous driving system based on the results of the testing. Some testing can be difficult to perform with the actual physical vehicles, as some environments can be encountered only rarely, so that collecting a sufficient volume of testing data can be challenging. Moreover, testing in some real-world high-stakes situations can be undesirable even though understanding the output of such a test may be beneficial.

Digital simulations can, therefore, be used to model a broader range of driving environments where the autonomous driving system can be challenged with having to operate under driving conditions that are difficult, undesirable, or risky or unsafe to replicate in the real world. Simulations can include simulated electromagnetic sensing data based on properties (e.g., amplitude, polarization, phase, etc.) of electromagnetic signals reflected by various simulated objects (cars, buildings, pedestrians, and so on) and detected by the electromagnetic sensing system of the autonomous vehicle. Responsive to receiving the simulated sensing data, the driving algorithm can chart a driving path relative to the simulated environment, select speed, make steering, acceleration, and braking decisions, make adjustments to the driving path to avoid an obstacle, or make other driving decisions, as would be made in real-life driving situations.

The fidelity of the simulations—the precision with which the simulations approximate realistic driving conditions—depend, among other things, on the availability and accuracy of the optical reflection data for the actual physical materials that are assumed to be present in various simulated objects. Although some optical reflectivity data (e.g., a bidirectional reflectance distribution function, BDRF) may be available for such physical materials in various databases of material parameters, including information used in modeling realistically looking objects in movie animations and computer gaming, the challenges encountered in the autonomous driving technology are rather unique. Specifically, while in animation and gaming, a direction from which the light is incident on a simulated object is typically different from a line of view of an observer (gamer, viewer), in the electromagnetic sensing (e.g., LiDAR) technology, the direction of sensing is very close to (and in many instances practically indistinguishable from) the direction of the emitted signals. Accordingly, the optical data that is of the most utility for simulating autonomous driving—the retro-reflectivity along the direction of incidence—is often unavailable in existing databases for materials encountered in typical driving environments.

Aspects and implementations of the present disclosure address these and other shortcomings of the existing technology by enabling autonomous vehicle simulations based on retro-reflection optical data collected for actual materials. The retro-reflection data can be collected in a laboratory setting by directing an electromagnetic beam at a surface of an object made of a specific material and detecting electromagnetic waves reflected along the direction of the incidence. The amount of the retro-reflected electromagnetic field can be characterized by a retro-reflectance distribution function (RRDF) that depends on the direction of the incident beam relative to the orientation of the object's surface. The RRDF is a bidirectional reflectance distribution function (BRDF) in which the direction of incidence and the direction of reflection are opposite to each other. The RRDF can be measured for a variety of materials encountered in different driving environments and for a variety of surfaces (rough, smooth, clean, soiled, etc.). The collected RRDF data can be stored in a location accessible to a driving environment simulator that can use the RRDF data, for the materials present in the simulated objects, to generate accurate simulated optical sensing data.

In simulations, each of the simulated objects can be assigned a specific material type (or multiple material types, in case of composite objects), whose retro-reflection properties may be available to an optical data simulator. The simulated optical data can include characteristics of electromagnetic signals that would be reflected by the simulated objects if the sensing system of the autonomous vehicle were directing electromagnetic beams at the respective simulated objects, e.g., at a specific angle. A data processing system can process the simulated optical data to determine the details of the driving environment, such as locations, speeds, directions of motion of the simulated objects, and so on. The autonomous vehicle control system can use the details of the driving environment to chart the driving path. Subsequently, the charted driving path can be evaluated to determine various metrics of the autonomous vehicle control system's performance, such as safety, driving time, fuel economy, computational efficiency, and so on. Based on the evaluations obtained using one or more simulated driving environments, the parameters of the autonomous vehicle control system can be adjusted to improve the system's performance.

FIG. 1 is a diagram illustrating components of an example autonomous vehicle that uses electromagnetic sensing and an autonomous driving system trained using retro-reflection data, in accordance with some implementation of the present disclosure. FIG. 1 illustrates operations of the example autonomous vehicle (AV) as used under actual driving conditions. Autonomous vehicles can include motor vehicles (cars, trucks, buses, motorcycles, all-terrain vehicles, recreational vehicle, any specialized farming or construction vehicles, and the like), aircraft (planes, helicopters, drones, and the like), naval vehicles (ships, boats, yachts, submarines, and the like), or any other self-propelled vehicles (e.g., side-walk delivery robotic vehicles) capable of being operated in a self-driving mode (without a human input or with a reduced human input).

A driving environment 110 can include any objects (animated or non-animated) located outside the AV, such as roadways, buildings, trees, bushes, sidewalks, bridges, mountains, other vehicles, pedestrians, and so on. The driving environment 110 can be urban, suburban, rural, and so on. In some implementations, the driving environment 110 can be an off-road environment (e.g. farming or agricultural land). In some implementations, the driving environment can be an indoor environment, e.g., the environment of an industrial plant, a shipping warehouse, a hazardous area of a building, and so on. In some implementations, the driving environment 110 can be substantially flat, with various objects moving parallel to a surface (e.g., parallel to the surface of Earth). In other implementations, the driving environment can be three-dimensional and can include objects that are capable of moving along all three directions (e.g., balloons, leaves, etc.). Hereinafter, the term "driving environment" should be understood to include all environments in which an autonomous motion of self-propelled vehicles can occur. For example, "driving environment" can include any possible flying environment of an aircraft or a marine environment of a naval vessel. The objects of the driving environment 110 can be located at any distance from the AV, from close distances of several feet (or less) to several miles (or more).

The example AV 100 can include an optical sensing system 120. The optical sensing system 120 can include various electromagnetic sensing subsystems and/or devices. The terms "optical" and "light," as referenced throughout this disclosure, are to be understood to encompass any electromagnetic radiation (waves) that can be used in object sensing to facilitate autonomous driving, e.g., distance sensing, velocity sensing, acceleration sensing, rotational motion sensing, and so on. For example, "optical" sensing can utilize a range of light visible to a human eye (e.g., the 380 to 700 nm wavelength range), the UV range (below 380 nm), the infrared range (above 700 nm), the radio frequency range (above 1 m), etc. In implementations, "optical" and "light" can include any other suitable range of the electromagnetic spectrum.

The optical sensing system 120 can include a radar unit, which can be any system that utilizes radio or microwave frequency signals to sense objects within the driving environment 110 of the AV 100. The radar unit can be configured to sense both the spatial locations of the objects (including their spatial dimensions) and their velocities (e.g., using the Doppler shift technology). Hereinafter, "velocity" refers to both how fast the object is moving (the speed of the object) as well as the direction of the object's motion. The term "velocity" can also include an angular velocity of the object's rotational motion.

The optical sensing system 120 can include a LiDAR unit (e.g., a LiDAR rangefinder), which can be a laser-based unit capable of determining distances (e.g., using the time of signal propagation technology) to the objects in the driving environment 110. The LiDAR unit can utilize wavelengths of electromagnetic waves that are shorter than the wavelength of the radio waves and can, therefore, provide a higher spatial resolution and sensitivity compared with the radar unit. The LiDAR unit can include one or more laser sources to produce emitted signals and one or more detectors of the signals reflected from the objects. The LiDAR unit can include spectral filters to filter out spurious electromagnetic waves having wavelengths (frequencies) that are different from the wavelengths (frequencies) of the emitted signals. In some implementations, the LiDAR unit can include directional filters (e.g., apertures, diffraction gratings, and so on) to filter out electromagnetic waves that can arrive at the detectors along directions different from the retro-reflection directions for the emitted signals. The LiDAR unit can use various other optical components (lenses, mirrors, gratings, optical films, interferometers, spectrometers, local oscillators, and the like) to enhance sensing capabilities of the unit. The LiDAR unit can be configured to operate in an incoherent sensing mode or a coherent sensing mode (e.g., a mode that uses heterodyne detection).

In some implementations, the LiDAR unit can be a 360-degree unit in a horizontal direction. In some implementations, the LiDAR unit can be capable of spatial scanning along both the horizontal and vertical directions. In some implementations, the LiDAR field of view can be up to 90 degrees in the vertical direction (so that at least a part of the upper hemisphere is covered by the LiDAR signals). In some implementations, the LiDAR field of view can be a full sphere (consisting of two hemispheres). For brevity and conciseness, when a reference to "LiDAR technology," "LiDAR sensing," "LiDAR data," and "LiDAR," in general, is made in the present disclosure, such reference shall be understood also to encompass other electromagnetic sensing technology, such as the radar technology, where applicable.

The optical sensing system 120 can further include one or more cameras to capture images of the driving environment 110. The images can be two-dimensional projections of the driving environment 110 (or parts of the driving environment 110) onto a projecting surface (flat or non-flat) of the camera. Some of the cameras of the optical sensing system 120 can be video cameras configured to capture a continuous (or quasi-continuous) stream of images of the driving environment 110.

The optical sensing data obtained by the optical sensing system 120 can be processed by a data processing system 130 of the AV 100. For example, the optical sensing system 120 can include an object detection system 132. The object detection system 132 can be configured to detect objects in the driving environment 110 and to recognize the detected objects. For example, the object detection system 132 can analyze images captured by the cameras of the optical detection system 120 and can be capable of determining traffic light signals, road signs, roadway layouts (e.g., boundaries of traffic lanes, topologies of intersections, designations of parking places, and so on), presence of obstacles, and the like. The object detection system 132 can further receive the LiDAR (including radar, if applicable) sensing data to determine distances to various objects in the environment 110 and velocities of such objects. In some implementations, the object detection system 132 can use the LiDAR data in combination with the data captured by the camera(s). In one implementation, the camera(s) can detect an image of a rock partially obstructing a traffic lane. Using the data from the camera(s), the object detection system 132 can be capable of determining the angular size of the rock, but not the linear size of the rock. Using the LiDAR data, the object detection system 132 can determine the distance from the rock and, therefore, by combining the distance information with the angular size of the rock, the object detection system 132 can determine the linear dimensions of the rock as well.

In another implementation, using the LiDAR data, the object detection system 132 can determine how far a detected object is from the AV and can further determine the component of the object's velocity along the direction of the AV's motion. Furthermore, using a series of quick images obtained by the camera, the object detection system 132 can also determine the lateral velocity of the detected object in a direction perpendicular to the direction of the AV's motion. In some implementations, the lateral velocity can be determined from the LiDAR data alone, for example, by recognizing an edge of the object (using horizontal scanning) and further determining how quickly the edge of the object is moving in the lateral direction.

The object detection system 132 can further receive sensing information from a GPS transceiver configured to obtain information about the position of the AV relative to Earth. The GPS data processing module 134 can use the GPS data in conjunction with the optical sensing data to help accurately determine location of the AV with respect to fixed objects of the driving environment 110, such as roadways, intersections, surrounding buildings, and so on. In some implementations, the data processing system 130 can receive non-electromagnetic data, such as sonar data (e.g., ultrasonic sensor data), temperature sensor data, pressure sensor data, meteorological data (e.g., wind speed and direction, precipitation data), and the like.

The data processing system 130 can further include an environment monitoring and prediction component 136, which can monitor how the driving environment 110 evolves with time, e.g., by keeping track of the locations and velocities of the animated objects (relative to Earth). In some implementations, the environment monitoring and prediction component 136 can keep track of the changing appearance of the environment due to motion of the AV relative to the environment. In some implementations, the environment monitoring and prediction component 136 can make predictions about how various animated objects of the driving environment 110 will be positioned within a prediction time horizon. The predictions can be based on the current locations and velocities of the animated objects as well as on the tracked dynamics of the animated objects during a certain (e.g., predetermined) period of time. For example, based on stored data for object 1 indicating accelerated motion of object 1 during the previous 3-second period of time, the environment monitoring and prediction component 136 can conclude that object 1 is resuming its motion from a stop sign or a red traffic light signal. Accordingly, the environment monitoring and prediction component 136 can predict, given the layout of the roadway and presence of other vehicles, where object 1 is likely to be within the next 3 or 5 seconds of motion. As another example, based on stored data for object 2 indicating decelerated motion of object 2 during the previous 2-second period of time, the environment monitoring and prediction component 136 can conclude that object 2 is stopping at a stop sign or at a red traffic light signal. Accordingly, the environment monitoring and prediction component 136 can predict where object 2 is likely to be within the next 1 or 3 seconds. The environment monitoring and prediction component 136 can perform periodic checks of the accuracy of its predictions and modify the predictions based on new data obtained from the optical sensing system 120.

The data generated by the object detection system 132, the GPS data processing module 134, and the environment monitoring and prediction component 136 can be used by an autonomous driving system, which can be a retro-reflection-trained autonomous vehicle control system (AVCS) 140. The AVCS 140 can include one or more algorithms that control how the AV 100 is to behave in various driving situations and environments. For example, the AVCS 140 can include a navigation system for determining a global driving route to a destination point. The AVCS 140 can also include a driving path selection system for selecting a particular path through the immediate driving environment, which can include selecting a traffic lane, negotiating a traffic congestion, choosing a place to make a U-turn, selecting a trajectory for a parking maneuver, and so on. The AVCS 140 can also include an obstacle avoidance system for safe avoidance of various obstructions (rocks, stalled vehicles, a jaywalking pedestrian, and so on) within the driving environment of the AV. The obstacle avoidance system can be configured to evaluate the size of the obstacles and the trajectories of the obstacles (if obstacles are animated) and select an optimal driving strategy (e.g., braking, steering, accelerating, etc.) for avoiding the obstacles. The AVCS 140 can be trained using simulations of virtual driving environments that can include actual retro-reflection data obtained in a lab setting for a variety of real-world materials, as described in detail in relation to FIGS. 2 and 3.

Algorithms and modules of AVCS 140 can generate instructions for various systems and components of the vehicle, such as the powertrain and steering 150, vehicle electronics 160, and other systems and components not explicitly shown in FIG. 1. The powertrain and steering 150 can include an engine (internal combustion engine, electric engine, and so on), transmission, differentials, axles, wheels, steering mechanism, and other systems. The vehicle electronics 160 can include an on-board computer, engine management, ignition, communication systems, carputers, telematics, in-car entertainment systems, and other systems and components. Some of the instructions output by the AVCS 140 can be delivered directly to the powertrain and steering 150 whereas other instructions output by the AVCS 140 are first delivered to the vehicle electronics 160, which generate commands to the powertrain and steering 150.

In one example, the AVCS 140 can determine that an obstacle identified by the data processing system 130 is to be avoided by decelerating the vehicle until a safe speed is reached, followed by steering the vehicle around the obstacle. The AVCS 140 can output instructions to the powertrain and steering 150 (directly or via the vehicle electronics 160) to 1) reduce, by modifying the throttle settings, a flow of fuel to the engine to decrease the engine rpm, 2) downshift, via an automatic transmission, the drivetrain into a lower gear, 3) engage a brake unit to reduce (while acting in concert with the engine and the transmission) the vehicle's speed until a safe speed is reached, and 4) perform, using a power steering mechanism, a steering maneuver until the obstacle is safely bypassed. Subsequently, the AVCS 140 can output instructions to the powertrain and steering 150 to resume the previous speed settings of the vehicle.

Figure 2:
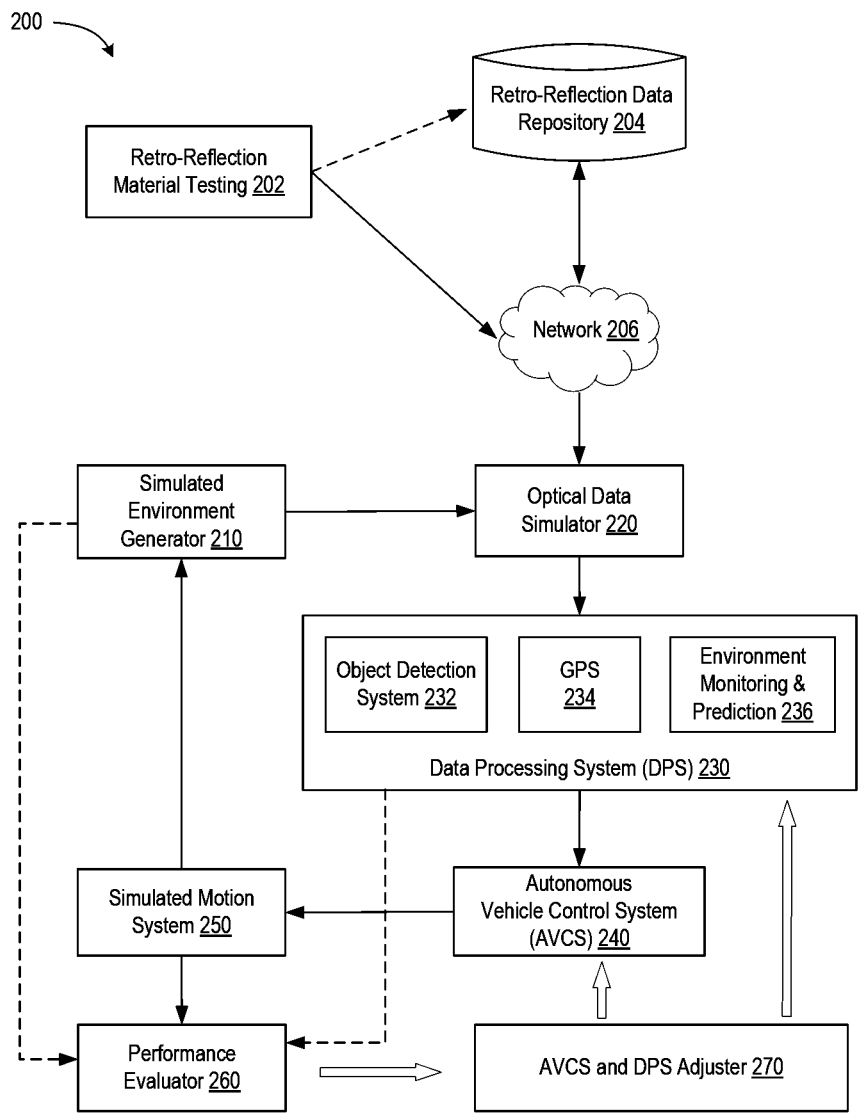
FIG. 2 is a diagram that illustrates components of an example virtual autonomous vehicle that enables simulations-based testing of an autonomous vehicle system using retro-reflection data for real-world materials, in accordance with some implementation of the present disclosure.

FIG. 2 is a diagram that illustrates components of an example virtual autonomous vehicle 200 that enables simulations-based testing of an autonomous vehicle system using retro-reflection data for real-world materials, in accordance with some implementation of the present disclosure. Some components depicted in FIG. 2 can correspond to the components depicted in FIG. 1. For example, the AVCS 240 of the virtual autonomous vehicle 200 can be the same as (or equivalent to) the AVCS 140 of the actual autonomous vehicle 100 operating in actual driving environments 110. Some components depicted in FIG. 2, as explained in more detail below, can be used in simulations-based testing but not included in the actual autonomous vehicle 100.

The simulation-based testing of the AVCS 240 can utilize retro-reflection data, which can be obtained using retro-reflection material testing 202 performed e.g., in a specialized metrology laboratory. In some implementations, the retro-reflection material testing 202 can be performed as described in relation to FIG. 3, by directing incident electromagnetic signals (e.g., beams, wave packets, and so on) at physical objects made of various materials that can be encountered in driving environments 110. By detecting electromagnetic waves reflected along substantially the direction of incidence, the retro-reflection data can be collected for a subsequent use in AVCS testing. The properties (e.g., amplitude, phase shift, polarization, and so on) of the retro-reflected signals can be determined by the object's material properties (e.g., a type of material, presence or absence of coatings, paint, etc.) and its optical properties (e.g., whether the object is transparent, reflecting, opaque, translucent, etc.). The strength of the retro-reflected signals can also depend on characteristics and quality of the object's surface (e.g., glossy, absorbing, dull, etc.) and a type of reflection from the surface (e.g., specular or diffuse, or a combination of specular and diffuse, etc.). The strength of the retro-reflected signals can further depend on the presence of extrinsic substances (e.g., water), contaminants (e.g., dust, dirt, etc.) on the surface of the object. The strength of the retro-reflected signals can, overall, depend on the wavelength of the signals, e.g., a material can be strongly reflecting in the optical and/or IR range, but be transparent to UV light, and so on.

The collected retro-reflection data can be stored in retro-reflection data repository 204 which can be a local or a network storage. The retro-reflection data repository 204 can be accessible to the virtual autonomous vehicle via a network 206, in one implementation. The network 206 can be a wide area network (WLAN), a local area network, a wireless network, or any other type of a network.

Because a variety of objects, materials, and types of surfaces occurring in a usual environment of an autonomous vehicle can be very large, safety and efficiency of the autonomous vehicle operations can be improved by exposing the vehicle's AVCS 240 to many types of objects and environments, testing the responses of the AVCS 240, and improving the AVCS 240 based on results of the testing. Many types of testing can be easier to perform using simulated objects rather than in the real-world environments.

Simulations (e.g., digital simulations) can, therefore, be used to model a broader variety of driving environments where AVCS 240 can be challenged with operating under driving conditions that are difficult or unsafe to replicate in the real world or with collecting additional data to supplement the real-world testing. A simulated digital environment, produced by a simulated environment generator 210, can be populated with various objects (roadways, buildings, sidewalks, trees, vehicles, pedestrians, etc.) having a multitude of optical responses to the LiDAR sensing. The simulated environment generator 210 can further specify which of the objects are stationary and which objects are moving and can further specify an initial position and orientation of the autonomous vehicle relative to the simulated environment. The simulation can further include a description of the driving path (relative to the simulated environment) for the autonomous vehicle or, in some implementations, generate modifications of the driving path as the autonomous vehicle makes its way through the simulated environment.

Digital simulations can further include simulated optical (e.g., LiDAR) sensing data produced by an optical data simulator 220. For example, the optical data simulator 220 can have access to the LiDAR specification, including parameters of sensing signals emitted by the LiDAR, such as intensity, wavelength, angular distribution, polarization, time duration of sensing pulses, number and directions of the sensing signals, and the like. Using the parameters of the simulated environment provided by the simulated environment generator 210, the optical data simulator 220 can determine the optical characteristics of electromagnetic waves incident on various simulated objects. The optical data simulator 220 can perform such determination based on the parameters of the sensing signals emitted by the LiDAR, spatial geometry, and temporal dynamics of the simulated environment. For example, based on the initial location, speed and direction of motion of an ambulance in the simulated environment, the optical data simulator 220 can determine the location of the ambulance at a specific moment of time when the LiDAR sensing signal reaches the ambulance. The optical data simulator 220 can further determine that the LiDAR sensing signal is to be incident on the windshield of the ambulance at a particular angle of incidence (e.g., 36 degrees). The optical data simulator 220 can further determine the amplitude (phase, the amount of s- and p-polarizations in the incident signal relative to the plane of incidence for the windshield, and so on) using the distance to the ambulance at the moment of signal incidence and the characteristics of the emitted signals.

The optical data simulator 220 can then retrieve, from the retro-reflection data repository 204 (stored, for example, on a local memory device or accessible via the network 206), optical properties of the materials of the simulated objects to determine the characteristics of the electromagnetic waves reflected from the simulated objects. The optical properties can include reflectivity values of the corresponding materials for the wavelengths of the sensing signals. The reflectivity values can depend on the type, quality, and characteristics of the surfaces of the simulated objects. In some implementations, the stored optical properties can include the retro-reflectance distribution function (RRDF), as defined later in conjunction with FIG. 3.

Based on the optical properties of the simulated objects, the simulator can determine (e.g., compute, using the distance from the autonomous vehicle to the object) the amplitude of the reflected signals detected by the LiDAR device. Using the previous example, the optical data simulator 220 can obtain from the simulated environment generator 210 the information that the windshield of the ambulance is made of a polycarbonate-bonded laminated glass. The optical data simulator 220 can retrieve, from the retro-reflection data repository 204, the optical retro-reflectivity data for such type of glass. The optical data simulator 220 can then determine the optical properties of the signals retro-reflected from the windshield. Using the distance from the windshield to the LiDAR device, the optical data simulator 220 can determine the characteristics of the reflected signals (e.g., amplitudes, phases, polarizations, etc.) detected by the LiDAR device. These characteristics can be highly accurate simulations of the characteristics of the actual signals received by the LiDAR device in a real-world driving environment.

Using the LiDAR device specifications (e.g., sensitivity, minimum signal-to-noise ratio, and the like), the optical data simulator 220 can then determine what data would be output by the actual LiDAR device, generate this data, and provide the generated data to the data processing system 230. For example, the optical data simulator 220 can output the current location and velocity of the ambulance, if the amplitude of the received signal is above a threshold amplitude (e.g., corresponding to a minimum signal-to-noise ratio). Alternatively, the optical data simulator cannot output any data about the ambulance if the strength of the reflected signals is below the threshold amplitude (the ambulance remains undetected for the time being). The data processing system 230 can be the same (or similar) to the actual data processing system 130 of the AV 100. The data processing system 230 can similarly include the object detection system 232, GPS processing module 234, environment monitoring and prediction component 236, and other systems and components not explicitly shown in FIG. 2. The object detection system 232 can be configured to detect objects in the simulated environment in a way that is similar to how the object detection system 132 recognizes the detected objects in an actual driving environment 110. The object detection system 232 can analyze simulated images of the simulated environment as if captured by the physical camera(s) of the optical detection system 120. The simulated images can be generated by the simulated environment generator 210 and/or by the optical data simulator 220. The object detection system 232 can use the simulated images to determine traffic light signals, road signs, roadway layout (e.g., boundaries of traffic lanes, topologies of intersections, designations of parking places, and so on), presence of obstacles, and the like. The object detection system 232 can also receive and process the simulated LiDAR data and can use the simulated LiDAR data in combination with the simulated images of the environment.

The object detection system 232 can further receive simulated data from the GPS data processing module 234. In some implementations, the simulated environment can be created based on an existing environment (e.g., a neighborhood of an actual city) for which GPS is known. In some implementations, the GPS data for the simulated environment can also be simulated (e.g., by the simulated environment generator 210). The environment monitoring and prediction component 236 can monitor how the simulated environment evolves with time, by keeping track of the locations and velocities of the simulated objects and predicting how various simulated objects can be positioned within a prediction time horizon. The predictions can be based on the current locations and velocities of the simulated objects as well as the tracked dynamics of the simulated objects during a certain (e.g., predetermined) period of time.

Using the above ambulance example, the object detection system 232 can determine, based on the simulated LiDAR data, the direction of motion and the speed of the ambulance. The object detection system 232 can further determine, based on the simulated images of the environment (which can include the images of the ambulance), that the emergency lights on the ambulance are operating. The environment monitoring and prediction component 236 can determine that the street light for the autonomous vehicle is green and that the autonomous vehicle and the ambulance, if they were to maintain their current velocities, would enter an intersection within 1 second of each other. The environment monitoring and prediction component 236 can also anticipate, based on the images of the emergency lights, that the ambulance will not stop at the intersection although the ambulance is likely to slow down somewhat before entering the intersection.

The data processing system 230 can output the results of the analysis of the optical data to the autonomous vehicle control system AVCS 240. The AVCS 240 can be the same as (or similar to) the AVCS 140 of the autonomous vehicle 100. The AVCS 240 can similarly include one or more algorithms that determine how the autonomous vehicle is to behave in various driving situations and environments. Specifically, the AVCS 240 can include the navigation system for determining a global driving route to a destination point, the driving path selection system for selecting a path through the driving environment, the obstacle avoidance system for avoiding various obstructions, and other modules and components.

Using the analysis information provided by the data processing system, the AVCS 240 can generate instructions for systems and components of the vehicle, such as the powertrain and steering systems, vehicle electronics, and other systems and components. In the above example of the ambulance, the AVCS 240 can evaluate various options for negotiating the intersection as the ambulance is approaching the intersection. In some implementations, the AVCS 240 can evaluate, e.g., 1) speeding up and clearing the intersection in time, 2) moving over to the rightmost traffic lane and stopping before the intersection, 3) slowing down and stopping before the intersection without changing lanes, and so on. The AVCS 240 can select, from the evaluated options, an option that receives a maximum score based on one or more decision-making metrics, such as the minimum distance to the approaching vehicle (namely, the ambulance), the time it would take to complete the chosen driving action, and so on. In some implementations, the AVCS 240 can make a selection of the driving path based on the information provided by the data processing system 230 that is generated based on environment monitoring over a period of time, e.g., a period of time of several seconds. In the above example, if the ambulance is approaching from behind the autonomous vehicle, the AVCS 240 can select the option of moving over and stopping, if the traffic is light. In some situations, where the traffic is heavy, the AVCS 240 can decide that moving over is not a viable option and can choose to proceed forward to clear the intersection promptly. If the ambulance is approaching from the left, right, or forward directions, the AVCS 240 can choose the option of stopping without changing lanes, as an example.

Based on the course of action selected and the driving path chosen, the AVCS 240 can output instructions intended for the powertrain, steering, vehicle electronics systems, as well as other components of the autonomous vehicle. The instructions can be output by the AVCS 240 in the same way as the same (or similar) instruction would be output if the AVCS 240 were in control of the actual physical autonomous vehicle (such as vehicle 100). In the virtual autonomous vehicle 200, the output instruction can be received by a simulated motion system 250 rather than by various intended hardware systems and components of the vehicle. For example, the AVCS 240 can output (and the simulated motion system 250 can receive) instructions to the powertrain and steering, e.g., to: 1) reduce, by modifying the throttle settings, a flow of fuel to the engine to decrease the engine rpm, 2) downshift the drivetrain into a lower gear, 3) steer the vehicle to the right, and 4) engage a brake unit to bring the vehicle to a complete stop. The simulated motion system 250 can receive these (or any other) instructions and determine the projected motion of the virtual autonomous vehicle 200 within the simulated driving environment. The simulated motion system 250 can determine, based on the instructions, the projected speed, acceleration, position of the front wheels and the resulting radius of the vehicle's trajectory, and further determine where the autonomous vehicle will move, in relation to various objects (static or animated) of the simulated environment. The simulated motion system 250 can continue processing the instructions received from the AVCS 240 and can adjust the projected motion of the virtual autonomous vehicle (e.g., in real time) as the AVCS 240 responds to new information about the changing driving environment received from the data processing system 230.

The simulated motion system 250 can provide data describing the projected motion of the virtual autonomous vehicle to the simulated environment generator 210. The simulated environment generator 210 can keep track of how the driving environment is to change with the passage of time. For example, in the simplest scenario where the simulated driving environment includes only static objects, the simulated environment generator 210 can determine how the static objects will appear relative to a reference frame of the autonomous vehicle. More specifically, the determination can include computing at what distances and at what angles of view the static objects will be observed from the autonomous vehicle, what objects and/or parts of the objects will be obscured by other objects, and so on. In more sophisticated simulations, where the simulated driving environment includes animated objects, the simulated driving environment generator 210 can determine how the motion of the animated objects is likely to be affected by the projected motion of the autonomous vehicle.

In the above example of the ambulance, the simulated motion system 250 can receive the instructions from the AVCS 240 for the powertrain and steering systems to implement operations that are to cause the autonomous vehicle to execute a maneuver by moving over to the right side of the roadway, slowing down, and coming to a complete stop. The simulated motion system 250 can project the trajectory and timeline for the maneuver. The simulated environment generator 210 can determine how the executed maneuver is likely to affect other vehicles on the roadway, e.g., how other vehicles (traveling behind, or on the sides of the autonomous vehicle, and so on) are expected to change their driving trajectories and speeds in response to the maneuver by the autonomous vehicle.

The projected dynamics of the simulated environment can be provided by the simulated environment generator 210 to the optical data simulator 220. The optical data simulator 220 can re-determine what optical data will be received by the optical sensing systems (e.g., LiDAR and/or radar devices, cameras) of the autonomous driving vehicle within the next time period. Consequently, the cycle of the data analysis and vehicle control, performed by the components 210-250 as described above, can be repeated until an occurrence of a stopping condition. The stopping condition can include, for example, reaching the destination point, completing the simulation task, accumulation of computational errors, interruption by a developer, and the like.

A performance evaluator 260 can have access to the data generated by the simulated motion system 250 and to the instructions provided by the AVCS 240 to the simulated motion system 250. The performance evaluator 260 can conduct evaluation of the driving path computed by the simulated motion system 250 upon the AVCS instructions. The evaluation can be performed using various predetermined metrics helpful in evaluating safety and efficiency of the driving path, correctness of the substance and the timing of various driving decisions made by the AVCS 240, and the like. As depicted schematically with dashed lines in FIG. 2, the performance evaluator 260 can have access to the information about the simulated driving environment (provided by the simulated environment generator 210) and the object detection and environment monitoring data (provided by the data processing system 230). Correspondingly, the performance evaluator 260 can be capable of comparing the objective picture of the simulated environment, as established by the generator 210), to the subjective picture of the same environment, as perceived by the data processing system 230 through the optical data simulator 220.

In some implementations, the performance evaluation can be performed as follows. The evaluation metrics used by the performance evaluator 260 can include the number and/or the nature of objects (within a certain predetermined distance from the autonomous vehicle) that were missed (undetected) by the object detection system 232. The evaluation metrics can include the number and/or the nature of animated objects (other vehicles, humans, animals, etc.) whose dynamics was predicted incorrectly by the environment monitoring and prediction component 236. The evaluation metrics can further include the number and/or the nature of the objects that happened to be (e.g., at any point during the driving simulations) inside a predetermined safety zone around the autonomous vehicle, including objects that made simulated physical contact with the autonomous vehicle. The evaluation metrics can also include the response times of the AVCS 240 to sudden changes of the environment, the braking distances, the margins of error in executing various driving maneuvers, the maximum accelerations or decelerations experienced by the autonomous driving vehicle, and so on. The evaluation metrics can also include measures of traffic disruptions caused to the simulated driving environment (e.g., pedestrians and other vehicles) by the motion of the autonomous driving vehicle in response to the instructions from the AVCS 240. The evaluation metrics can also include measures of a number and nature of instances where the retro-reflected signal has been returned with such a high intensity (for example from a strong specular reflection) that the optical data simulator was temporarily "blinded" (saturated with the signal) and, therefore, became less capable of distinguishing dimmer objects whose detection nonetheless was of significance to the AVCS 240 in selecting a correct driving path. The evaluation metrics can be established and selected by developers of the autonomous vehicle technology, e.g., by a team of software and hardware experts, based on testing of real-world autonomous driving vehicles. In some implementations, some of the evaluation metrics can be specific to a type of the simulated driving environment whereas some of the evaluation metrics can be universal. For example, the evaluation metrics for rural driving environments can be different from the evaluation metrics for urban driving environments, For example, the evaluation metrics for rural environments can emphasize timely detection of oncoming vehicles during overtaking maneuvers and detection of steep terrain features (such as rocks and drop-offs located in proximity to roadways). On the other hand, the evaluation metrics for urban environments can emphasize timely detection of pedestrians, bicyclists, and street light changes. Likewise, the evaluation metrics for passenger vehicles can be different from the evaluation metrics for autonomous cargo vehicles. For example, the evaluation metrics for passenger vehicles can emphasize the ride comfort whereas the evaluation metrics for cargo vehicles can place more emphasis on fuel economy.

The performance evaluator 260 can assess the performance of the AVCS 240 and/or the data processing system (DPS) 230 using the evaluation metrics and provide the results of the evaluation to the AVCS and DPS adjuster component 270. In some implementations, the adjuster 270 can be a software module that presents the results of the evaluation to a user or developer of the autonomous driving system. The adjuster 270 can further be configured to receive instructions from the user or developer to modify one or more of the components or systems of FIG. 2, e.g., the object detection system 232, the environment monitoring and prediction component 236, and/or one of the driving algorithms of the AVCS 240, including but not limited to the engine control algorithm, the steering algorithm, the braking algorithm, or any combination thereof. In some implementations, the adjuster 270 can provide recommendations to the developer to change one or more of the systems and components of the autonomous driving vehicle. Responsive to the developer selecting one of the recommended options, the adjuster 270 can implement the selected option. In some implementations, the adjuster 270 can modify the AVCS 240 and/or DPS 230 automatically, without any human input. For example, the performance evaluator 260 can indicate that the minimum distance to a dark car having a glossy appearance and low retro-reflectivity in the optical range of wavelengths is below a safety margin. Responsive to receiving such indication, the adjuster 270 can factor in a possible delayed detection of dark cars with low retro-reflectance and modify the braking algorithm of the AVCS 240 to increase the amount of braking when deceleration of the autonomous vehicle is performed responsive to initial detection of a dark car.

The improvement of the autonomous driving algorithms and components, as implemented via the performance evaluator 260 and the adjuster 270, can depend on the fidelity of the simulations—the precision with which the simulations approximate realistic driving conditions. The fidelity of the simulations, in turn, can depend on the availability and accuracy of the optical reflection data for various materials that are assumed to be present in various simulated objects. The materials can include pavement materials (concrete, asphalt, gravel, etc.), building materials (brick, steel, glass, concrete, wood, stucco, roofing shingles, etc.), vehicle materials (steel, aluminum, titanium, plastic, carbon, auto glass), and so on. Even though some optical reflectivity data for some of the materials encountered in driving environments can be available in various databases of material parameters (e.g., used in modeling realistically looking objects in movie animations and computer gaming), the challenges encountered in autonomous driving technology are rather specialized. In particular, in animation and gaming, a direction from which the light is incident on simulated objects is typically different from a line of view of an observer (player, viewer). In contrast, in the LiDAR detection technology, the direction of reflected signals is very close to (and in many instances practically indistinguishable from) the direction of the emitted signals. Indeed, the distances of LiDAR sensing are often thousands of times greater than the distance between the laser and the detector within the LiDAR device mounted on an autonomous vehicle.

Accordingly, the optical data that is of the most utility for simulating autonomous driving—the retro-reflectivity (reflectivity in the direction along the direction of incidence)—is often unavailable in existing databases for materials encountered in various driving environments. On the other hand, retro-reflection optical data is not readily interpolated from other optical data, such as bidirectional reflectance distribution function (BDRF).

Figure 3:
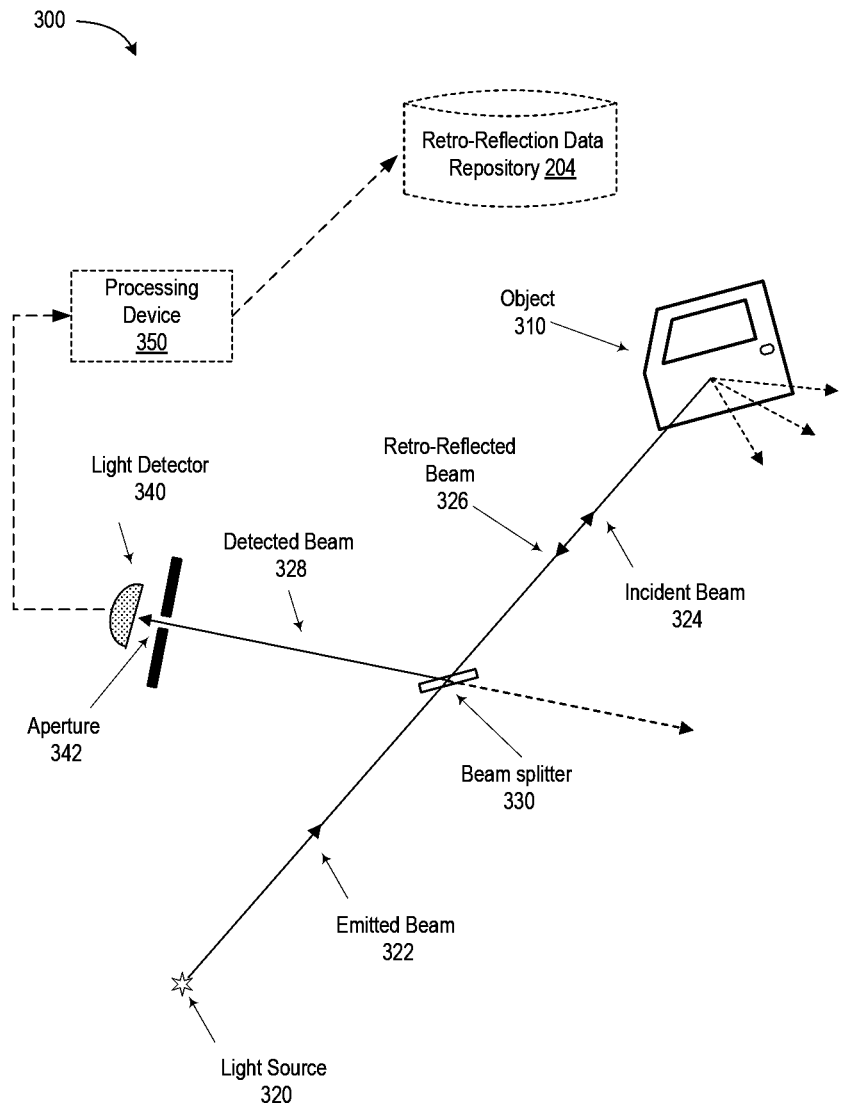
FIG. 3 is a schematic diagram that depicts an example metrology device capable of obtaining retro-reflectivity data for materials that can be encountered in various driving environments, in accordance with some implementation of the present disclosure.

FIG. 3 is a schematic diagram that depicts an example metrology device 300 capable of obtaining retro-reflectivity data for materials that can be encountered in various driving environments, in accordance with some implementation of the present disclosure. The metrology device 300 can be used to measure material properties (e.g., optical properties) of an object 310 which can be any object that can reflect sensing signals used in an autonomous driving vehicle sensing technology, such as a part of a vehicle, an element of a building, a road sign, an article of pedestrian's or bicyclist's clothing, and the like. The object 310 need not be a whole object, but may rather represent a part of an object, if it is impractical or impossible to deliver the whole object into the laboratory setting. For example, the object 310 can be an element of some of the following: metal or concrete wall, road pavement, metal pole, wood, building glass, road surface markings, tire rubber, tree bark or foliage, animal fur or feather, car emissions, dust or sand, or samples of any other materials that can be found in a driving environment. Each element or sample can be tested for various types of surfaces. For example, an element of a vehicle (car door) can be unpainted, painted with auto paint without clear coating, painted with clear coating, and so on. An element of a vehicle can be painted with any type of paint (e.g., base, metallic) and with any paint color. The object 310 can be transparent (automotive glass, building glass, etc.) or non-transparent (concrete, metal, wood, etc.). The object 310 can have a surface of any type and quality: glossy, dull, highly reflective, specular, diffuse, and so on. The object 310 can be transparent to some electromagnetic waves but reflective for other electromagnetic waves. For example, metallic objects can reflect visible light but be transparent to UV light. The object 310 can be transparent to some electromagnetic waves but absorptive of other electromagnetic waves. For example, glass objects can be transparent to visible light but absorb UV light.

The object 310 (or any part thereof) can be held stationary relative to other parts of the metrology device 300, by using any kind of a holding device (a clamp, vice, fasteners, and so on). The holding device can be configured to be rotated so that an incident beam of light produced by a light source 320 can be capable of striking the surface of the object 310 at any angle (e.g., to the direction perpendicular to the surface of the object 310). In some implementations, the holding device can be configured to shift relative to the incident beam 324, so that the incident beam can scan various locations of the object 310 and obtain reflectance data that is a function of the location of the striking point of the beam. In some implementations, the object can remain stationary, but the scan across various locations of the object 310 can be performed by rotating the metrology device 300.

The metrology device 300 can have one or more light sources 320. The light source 320 can be a narrow-band source (e.g., a laser, a light-emitting diode). The light source 320 can include two or more narrow-band sources of light (e.g., two or more lasers operating at different wavelengths). The light source 320 can include one (or more) broadband source(s) of light 114. The light source can produce an emitted beam 322 directed at the object 310. The emitted beam 322 can be a continuous beam (e.g., a Gaussian beam, in some implementations) or can be a collection of electromagnetic pulses (wave packets) having a spaced arrangement. The wavelength(s) of the emitted beam can be in the IR, visible, or UV parts of the electromagnetic spectrum. Depending on an implementation, the emitted beam can be coherent or incoherent. In some implementations, the emitted beam 322 can be narrowed, filtered, focused, polarized, or otherwise shaped and modified using a variety of optical devices, such as mirrors, lenses, polarizers, filters (not explicitly shown in FIG. 3).

The emitted beam 322 can pass through a beam splitter 330 to produce an incident beam 324 directed to strike the object 310. The beam splitter 330 can be a single-material beam splitter or a beam-splitter made from a combination of different materials. In some implementations, the beam splitter 330 can be a polarizing beam splitter. The incident beam 324 emerging from the beam splitter 330 can be further filtered, polarized, or otherwise shaped or processed. In some implementations, the incident beam 324 can be focused on the object 310 using one or more lenses and/or concave mirrors. The object 310 can reflect the incident beam 324, as depicted schematically in FIG. 3 with dashed rays emerging from the point of incidence. Generally, the reflected waves propagate away from the object 310 along all directions. For almost specular reflection, most of the reflection occurs along the direction of specular reflection. For almost diffuse reflection, the energy of the reflected waves propagates uniformly across all directions. For most objects, a combination of specular reflection and diffuse reflection is expected to take place.

The metrology device 300 is configured to probe the retro-reflection of the object 310. Specifically, a retro-reflected beam 326, which propagates along the direction of the incident beam 326 (albeit in the reverse direction), can pass through the beam splitter 330. The beam splitter 330 redirects a part of the retro-reflected beam 326 towards a light detector 340. (Another part of the retro-reflected beam 326 can pass through the beam splitter in the direction of the light source 320 and not be detected.). A beam-narrowing aperture 342 can be positioned between the beam splitter 330 and the light detector 340 to ensure that only the waves reflected sufficiently close to the retro-reflection direction are striking the light detector 340 (to approximate realistic LiDAR sensing scenario). The size of the aperture can be selected to balance the two competing objectives: 1) to probe the retro-reflected light within a narrow range of the reflection angles while 2) ensuring a sufficiently high signal-to-noise ratio for accurate reflection measurements.

The light detector 340 can include one or more photo-diodes, photo-transistors, photo-resistors, photo-multipliers, photovoltaic devices, spectrometers, diffraction gratings, or any other optical detection devices. The optical data obtained by the light detector 340 can be communicated to a processing device 350, which can extract retro-reflectivity data from the optical data. The processing device 350 can store the obtained retro-reflectivity data in the retro-reflectivity data repository 204.

The retro-reflectivity data can be represented in terms of a retro-reflectance distribution function (RRDF). In some implementations, the RRDF can be defined as follows:

$$F_{RRDF}(\vec{n}) = \frac{dP_R/(d\Omega_R dA_\perp)}{dP_I/dA},$$

namely, as the ratio of two quantities: 1) the power of reflected radiation $dP_R$ emitted per solid angle $d\Omega_R$ near the direction of reflection and per area $dA_\perp$ that is perpendicular to the direction of reflection (the emitted radiance), to 2) the incident irradiance received by the surface of the object 310, which is the ratio of the power of the incident beam $dP_I$ to the area of the surface dA receiving this power. The unit vector $\vec{n}$ specifies the direction of the retro-reflected beam (which, up to the sign, coincides with the direction of incidence). In some implementations, the direction of the unit vector $\vec{n}$ can be parameterized via two angles, e.g., the polar angle that the retro-reflection direction (or the incidence direction) makes with the direction perpendicular to the surface of the object 310, and an azimuthal angle that the retro-reflection direction makes with some reference direction along the surface. In general, the RRDFs for anisotropic materials, which have different properties for different directions along the surface, can depend on the azimuthal angle (anisotropic RRDF). In some implementations, where the surface of the object 310 is isotropic, the RRDF can depend on the polar angle only (isotropic RRDF). As defined, the RRDF can represent a subset of the bi-directional reflectance distribution function BRDF, $F_{BRDF}(\vec{m}, \vec{n})$, which depends on two directions—the direction of the incident beam $\vec{m}$ and the direction of the reflected beam $\vec{n}$. In this respect, $F_{RRDF}(\vec{n}) = F_{BRDF}(-\vec{n}, \vec{n})$.

During data acquisition, the relative orientation of the surface of the object 310 to the direction of the retro-reflected beam can be controlled (e.g., by the processing device 350). For a plurality of different orientations $\vec{n}$, the irradiance of the surface of the object 310, $dP_I/dA$, can be controlled by tuning the brightness of the light source 320, by the settings of the beam splitter 330, and/or by using various optical elements (lenses, polarizers, filters, etc.). The radiance (per solid angle) reflected back from the object 310, $dP_R/(d\Omega_{RR}dA_\perp)$, can be measured by the light detector 340, with the angular resolution controlled by varying the size of the aperture 342. The RRDF acquisition can be performed for a large number (quasi-continuously) of $\vec{n}$ values so that the RRDF is sampled with a high degree of resolution. The acquired RRDF data can be subsequently stored in the retro-reflection data repository 204.

In some implementations, instead of indexing an RRDF by the direction of $\vec{n}$, the RDFF can be approximated by a fitting function having a number of parameters. For example, an isotropic RRDF can be approximated with an expansion over Legendre polynomials, $$F_{RRDF}(\theta) = \sum_{l=0}^{N-1} A_l P_l(\cos\theta),$$

with N fitting parameters $A_l$. Parameter $A_0$ describes the isotropic channel of retro-reflection, parameter $A_1$ describes the dipolar channel, parameter $A_2$ describes the quadrupolar channel, and so on. In some implementations, where an object reveals anisotropic retro-reflection, an RDFF can be approximated with an expansion over the spherical harmonics, $$F_{RRDF}(\theta, \phi) = \sum_{l=0}^{N-1} \sum_{m=-l}^{l} A_{lm} Y_{lm}(\theta, \phi),$$

with $N^2$ fitting parameters $A_{lm}$. The number N can be chosen depending on the accuracy required to achieve a target degree of fidelity of the simulations. The N fitting parameters $A_l$ or $N^2$ fitting parameters $A_{lm}$ can be determined (e.g., by the least square method) from a comparison with retro-reflection measurements. In some implementations, multiple RRDF (e.g., corresponding to different linear, circular, or elliptic polarizations) can be measured and stored for the same material (and surface) type.

As described above in the context of the virtual autonomous vehicle of FIG. 2, the RRDF (or an equivalent representation of retro-reflectance, e.g., in terms of a differential scattering cross section) can be used by the optical data simulator 220. The RRDF data can be indexed by a type of material (e.g., concrete, glass, painted metal, unpainted metal, etc.), by the quality of the surface of the material (polished, rough, etc.), by the conditions of the surface (clean, soiled, oily, wet, muddy, etc.), or any combination thereof. The optical data simulator 220 can then retrieve the RRDF corresponding to the material type, surface, and/or condition of the surface. For example, retrieving the RRDFs can include retrieving the fitting parameters used to approximate the corresponding RRDF.

Figure 4A:
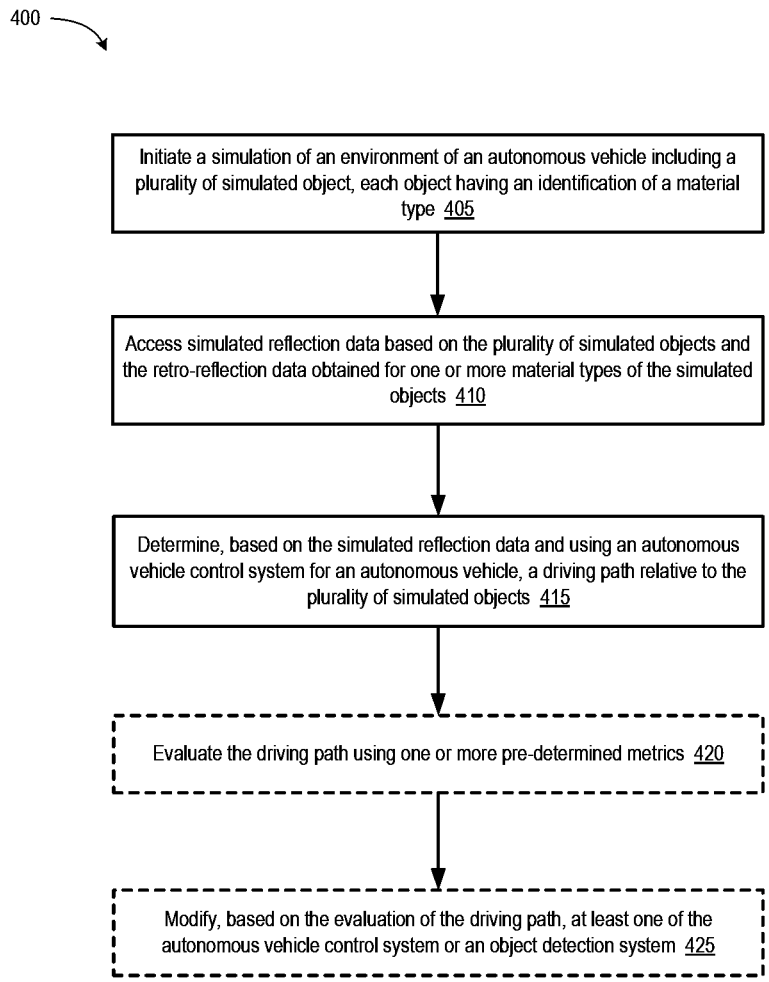
FIG. 4A depicts a flow diagram of an example method of using simulations-based testing of an autonomous vehicle system using retro-reflectivity data for real-world materials, in accordance with some implementations of the present disclosure.

FIG. 4A depicts a flow diagram of an example method 400 of using simulations-based testing of an autonomous vehicle system using retro-reflectivity data for real-world materials, in accordance with some implementations of the present disclosure. Method 400, as well as methods 450, 500 described below, and/or each of their individual functions, routines, subroutines, or operations can be performed by a processing device, having one or more processing units (CPU) and memory devices communicatively coupled to the CPU(s). In certain implementations, methods 400, 450, and 500 can be performed by a single processing thread. Alternatively, methods 400, 450, and 500 can be performed by two or more processing threads, each thread executing one or more individual functions, routines, subroutines, or operations of the method. In an illustrative example, the processing threads implementing methods 400, 450, and 500 can be synchronized (e.g., using semaphores, critical sections, and/or other thread synchronization mechanisms). Alternatively, the processing threads implementing methods 400, 450, and 500 can be executed asynchronously with respect to each other. Various operations of methods 400, 450, and 500 can be performed in a different order compared with the order shown in FIGS. 4A, 4B, and 5. Some operations of the methods can be performed concurrently with other operations. Some operations can be optional.

Method 400 can be directed to systems and components of an autonomous driving vehicle, such as the autonomous vehicle 100 of FIG. 1 or the virtual autonomous vehicle 200 of FIG. 2. Method 400 can be used to improve the autonomous vehicle control systems 140, 240 and/or the autonomous vehicle data processing systems 130, 230. Method 400 can include, initiating, at block 410, by a computing device performing method 400, a simulation of an environment of an autonomous driving vehicle. For example, the computing device can request that the simulated environment generator 210 provide the simulation. The simulation provided by the simulated environment generator 210 can include a plurality of simulated objects. Each or some of the plurality of simulated objects can have a description that includes an identification of a material type of the respective simulated object. For example, a simulated object can be a traffic sign and the identification of the traffic sign can include a description that the traffic sign is made of steel. The descriptions of the simulated objects can further include one or more characteristics of a surface of the respective simulated object. For example, the descriptions can specify that the road sign is painted with a yellow paint and has a smooth and matte surface or that a simulated motorcycle has a black color and a glossy surface.

At block 410, method 400 can continue with the computing device accessing simulated retro-reflectivity data for one or more material types of the simulated objects. The simulated retro-reflectivity data can be generated and provided by the optical data simulator 220 based on the material types of the simulated objects and on the actual (real-life) retro-reflectivity data collected for the respective more material types of the simulated objects and stored in the retro-reflection data repository 204, which can be accessible to the processing device via a local bus, a local area network, or over any other network (e.g., via Internet).

In some implementations, the simulated reflection data includes simulated strengths of beams retro-reflected from each or some of the simulated objects. The generated simulated strengths of beams can be based on a distance from the autonomous vehicle to the respective simulated object. For example, based on the current distances from the autonomous vehicle to various simulated objects and angles at which the simulated objects are seen from the vantage point of the autonomous vehicle, the computing device (e.g., implementing the optical data simulator 210) can determine characteristics of the LiDAR sensing signals incident on the simulated objects. The characteristics of the sensing signals can include the angles of incidence, polarizations, amplitudes, and so on. Based on the stored retro-reflectivity data for the materials (and the respective surface types), the optical data simulator 210 can determine the amplitudes, polarizations, phases, of the signals (beams, wave packets, etc.) reflected from the simulated objects.

In some implementations, the simulated strengths of the beams retro-reflected from some (e.g., a first subset) of the simulated objects can be generated based on measured retro-reflectivity values for each of the material types of the respective simulated objects. For example, the simulated strengths can be obtained from the stored RRDF for the respective material or from some representation of the RRDF, such as a representation based on a number of fitting parameters for the RRDF. In some implementations, the simulated strengths of the beams retro-reflected from some (e.g., a second subset) of the simulated objects can be generated based on modeled retro-reflectivity values for the respective simulated objects. For example, a particular material type used in the simulation may not have been tested in the metrology laboratory and its RRDF may not be known. The respective RRDF can be modeled, e.g., using a number of fitting parameters. The fitting parameters can be selected based on the fitting parameter for similar types of materials (and types of surfaces) available in the retro-reflection data repository. For example, an RRDF of a yellow car door may not be available, but can be modeled based on the known RRDFs of a red car door and a green car door.

At block 415, method 400 can continue with determining, using the AVCS 240 for the autonomous vehicle, a driving path relative to the simulated objects. The driving path can be based on the simulated reflection data. Determining the driving path can include receiving, by the AVCS, from an object detection system, information about one or more identified simulated objects. The information about the one or more identified objects can be generated by the object detection system 232 using the simulated reflection data for the simulated objects.

At (optional) block 420, method 400 can continue with the computing device evaluating the driving path using one or more predetermined metrics. The predetermined metrics can include a minimum distance from the autonomous vehicle, traveling along the simulated driving path, to one or more of the simulated objects. In some implementations, the predetermined metrics can include a missed object. A simulated object can be considered missed if a retro-reflection intensity for the corresponding object is below a threshold detection intensity. At block 425, the processing device performing method 400 can modify, based on the evaluation of the driving path, the AVCS or the object detection system of the autonomous vehicle.

Figure 4B:
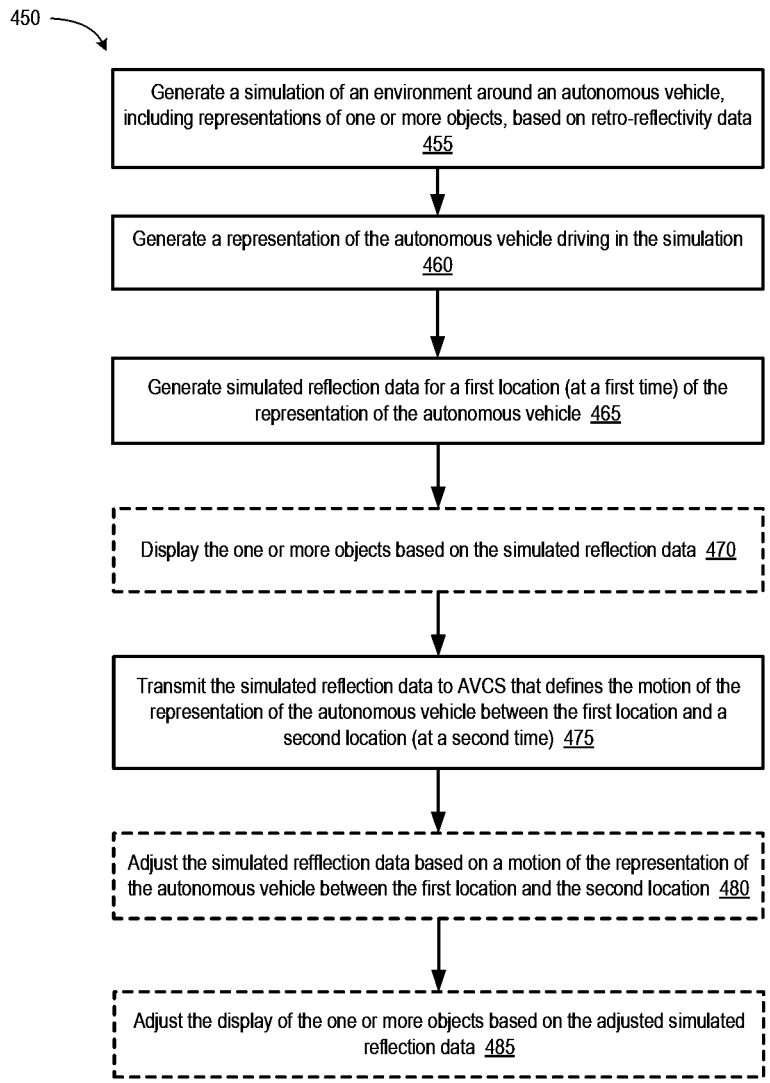
FIG. 4B depicts a flow diagram of an example method of providing simulations for simulation-based testing of an autonomous vehicle system, in accordance with some implementations of the present disclosure.

FIG. 4B depicts a flow diagram of an example method 450 of providing simulations for simulation-based testing of an autonomous vehicle system, in accordance with some implementations of the present disclosure. At block 455, the computing device performing method 450 can generate a simulation of an environment around an autonomous vehicle, e.g., by implementing the simulated environment generator 210. The simulation can include representations of one or more simulated objects. The representations can describe the sizes, locations, speeds, directions of motion, etc., of the simulated objects. The representations can further describe physical and/or optical properties of the simulated objects, such as the type, quality, reflectivity, etc., of the surfaces of the simulated objects. Some of the properties of the simulated objects can be based on retro-reflectivity data collected using test sensors, which can be performed in an actual driving environment or in a laboratory environment.

At block 460, the computing device can generate a representation of the autonomous vehicle driving in the simulation. For example, the simulated environment generator 210 can generate a first (initial) location of the autonomous vehicle at a first instance of time, which can be the time corresponding to the start of the simulation. The simulated environment generator 210 can further identify the type (car, truck, bus, and the like) of the vehicle, the speed of the vehicle, its orientation relative to the road and to the simulated objects, and so on. The representation of the autonomous vehicle can further include types and locations of one or more simulated sensors (e.g. LiDAR sensors). For example, the simulated sensors can be located on the roof of the autonomous vehicle and the representation of the autonomous vehicle can include description where the simulated sensors are located (e.g., in the middle or front of the vehicle, at what specific height, and so on).

At block 465, method 450 can continue with the computing device generating simulated reflection data for the first location associated with the representation of the autonomous vehicle at a first instance of time relative to the simulated objects. The simulated reflection data can be generated by the optical data simulator 220 and can be based on the representations of the simulated objects, such as the distances from the simulated objects to the simulated location of the autonomous vehicle, angles at which the simulated objects are visible to the simulated sensors on the autonomous vehicle and so on. The optical data simulator 220 can assume that the simulated sensor is of the same (or similar) type and model (e.g., produced by the same manufacturer and/or subject to the same standards) and has the same (or similar) settings as at least one of the test sensors used to collect retro-reflectivity data. For example, in some implementations, the retro-reflectivity data is collected using actual LiDAR sensors used with the autonomous vehicle (or with similar types of autonomous vehicles). In other implementations, the test sensors used to collect retro-reflectivity data can be different from the actual LiDAR sensors, but can have the same (or similar) wavelength, linewidth (e.g., narrowband or broadband), maximum intensity, average intensity, pulse profile (duration and rate of emission), field of view, range of action, e.g., short-range (up to 20 m), medium range (20 to 100 m), long-range (over 100 m), and so on.

At optional block 470, the computing device can provide a display of the simulated objects, e.g., to an engineer or developer, based on the simulated reflection data. For example, the developer can be presented with a user interface showing how the simulated objects are perceived by the object detection system 232 of the autonomous vehicle.

At block 475, method 450 can continue with transmitting the simulated reflection data to a system (e.g., AVCS 240) that provides instructions for driving the autonomous vehicle in the simulation. The instructions provided by AVCS 240 can be based on the simulated reflection data in the same manner as AVCS 240 would process the real-world optical data received from actual sensors located on the autonomous vehicle. The instructions can be provided to the simulated motion system 250 which can determine, based on the provided instructions how the autonomous vehicle is to move between the first location and the second location (at a second time which is later than the first time) relative to the simulated objects.

At block 480, the computing device performing method 450 can adjust the simulated reflection data based on the motion of the representation of the autonomous vehicle between the first location and the second location relative to the one or more objects. For example, once the simulated motion system 250 has determined where the autonomous vehicle is to be located at the second time (e.g., how much the vehicle has moved from the first location), the optical data simulator 220 can adjust the simulated reflection data that the sensors of the autonomous vehicle are to receive at the second location. Such adjustment can be based on the modifications of distances from the simulated sensor on the representation of the autonomous vehicle to the one or more simulated objects. Furthermore, such adjustment can also be based on the modifications of angles of incidence of beams directed to the one or more objects from the simulated sensor on the representation of the autonomous vehicle. At optional block 485, method 450 can continue with the computing device altering the display of the one or more objects in the simulation (to the engineer or developer) based on the adjusted reflectivity data.

Figure 5:
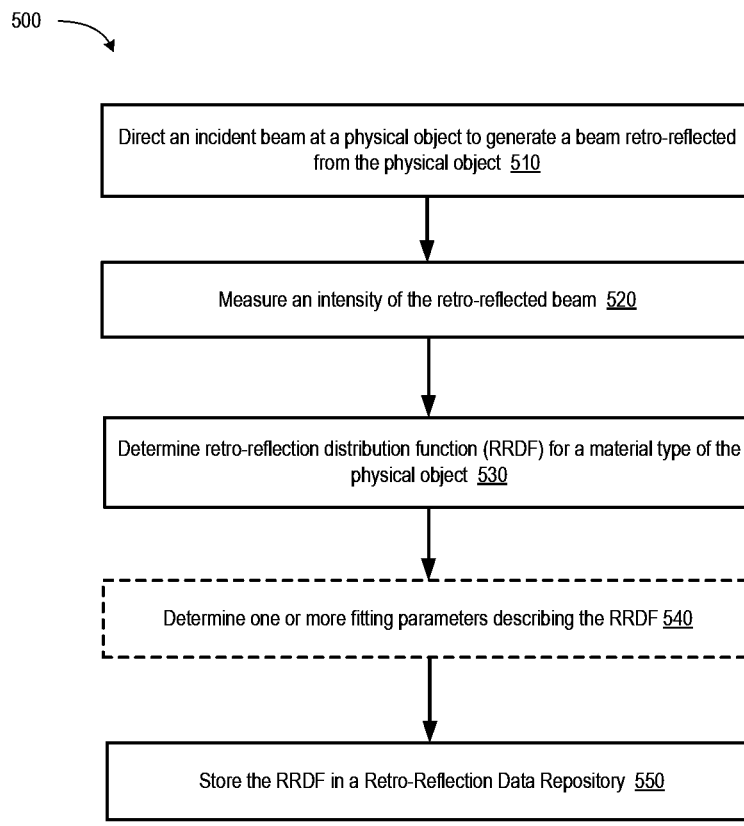
FIG. 5 depicts a flow diagram of an example method of obtaining retro-reflection data for real-world materials that can be encountered in driving environments, for high-fidelity simulations of autonomous vehicles, in accordance with some implementations of the present disclosure.

FIG. 5 depicts a flow diagram of one illustrative example of a method 500 of obtaining retro-reflection data for real-world materials that can be encountered in driving environments, for high-fidelity simulations of autonomous vehicles, in accordance with some implementations of the present disclosure. Method 500 can be used to provide retro-reflection data for improving the autonomous vehicle control systems 140, 240 and/or the autonomous vehicle data processing systems 130, 230. Method 500 can include directing, at block 510, an incident beam at a physical object to generate a beam retro-reflected from the physical object. Directing of the incident beam can be performed as shown in FIG. 3, in some implementations, e.g., by using a beam splitter. The material type of the object can be used to index the retro-reflection data.

At block 520, method 500 can continue with measuring an intensity of the retro-reflected beam. The retro-reflected beam can initially follow the direction of the incident beam but can be directed away (e.g., by the beam splitter) from that direction and towards a light detector. At block 530, method 500 can continue with determining, from the measured intensities of the retro-reflected beam, and for various relative orientations of the object and the incident beam, the RRDF for the object. At (optional) block 540, a processing device can determine one or more fitting parameters for compact description of the determined RRDF. At block 550, the determined RRDF or one or more fitting parameters can be stored in the retro-reflection data repository in such a way that would make the RRDF available to the processing device performing method 400.

Figure 6:
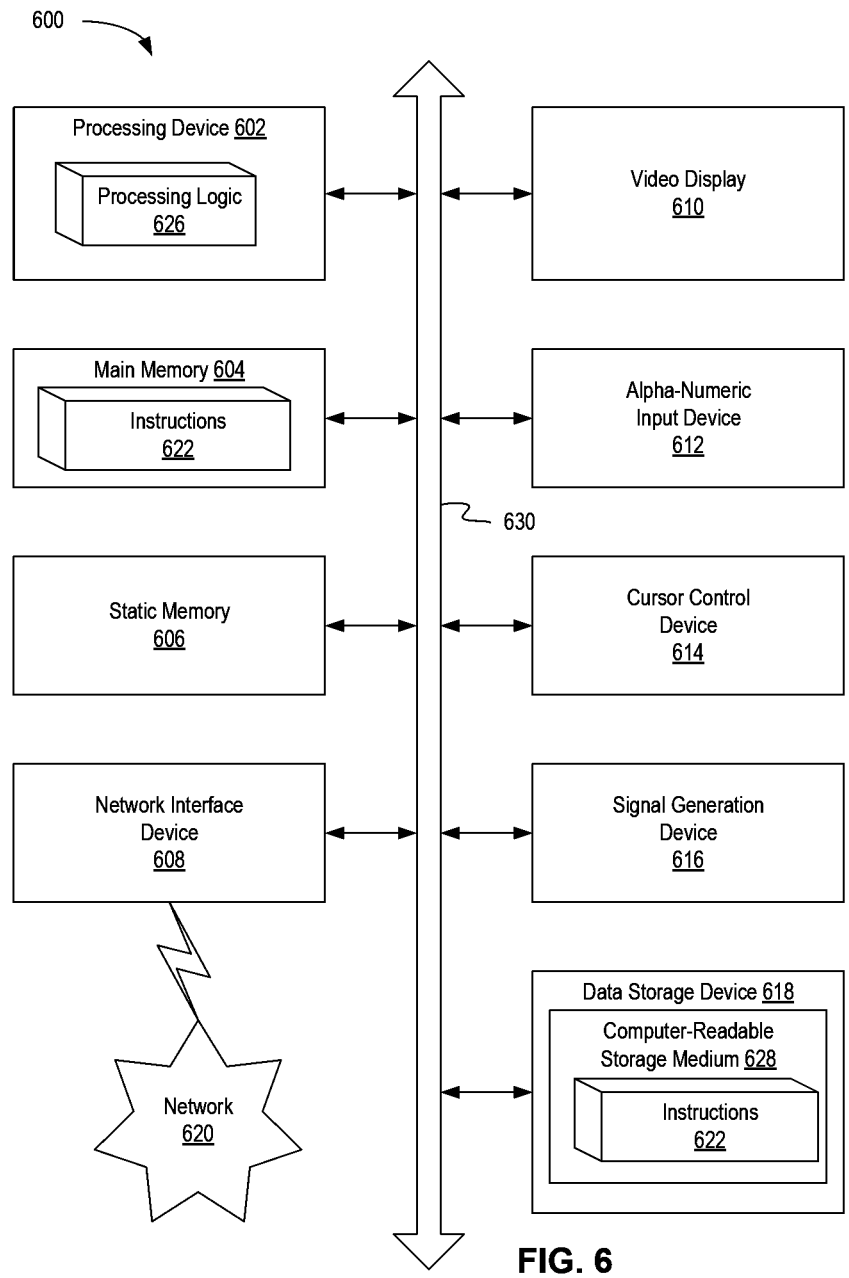
FIG. 6 depicts a block diagram of an example computer device that can enable simulations-based testing to improve autonomous vehicle systems using retro-reflection data for real-world materials and obtaining retro-reflection data for real-world materials that can be encountered in driving environments.

FIG. 6 depicts a block diagram of an example computer device 600 capable of enabling simulations-based testing for improving autonomous vehicle systems using retro-reflection data for real-world materials and obtaining retro-reflection data for real-world materials that can be encountered in driving environments. Example computer device 600 can be connected to other computer devices in a LAN, an intranet, an extranet, and/or the Internet. Computer device 600 can operate in the capacity of a server in a client-server network environment. Computer device 600 can be a personal computer (PC), a set-top box (STB), a server, a network router, switch or bridge, or any device capable of executing a set of instructions (sequential or otherwise) that specify actions to be taken by that device. Further, while only a single example computer device is illustrated, the term "computer" shall also be taken to include any collection of computers that individually or jointly execute a set (or multiple sets) of instructions to perform any one or more of the methods discussed herein.

Example computer device 600 can include a processing device 602 (also referred to as a processor or CPU), a main memory 604 (e.g., read-only memory (ROM), flash memory, dynamic random access memory (DRAM) such as synchronous DRAM (SDRAM), etc.), a static memory 606 (e.g., flash memory, static random access memory (SRAM), etc.), and a secondary memory (e.g., a data storage device 618), which can communicate with each other via a bus 630.

Processing device 602 represents one or more general-purpose processing devices such as a microprocessor, central processing unit, or the like. More particularly, processing device 602 can be a complex instruction set computing (CISC) microprocessor, reduced instruction set computing (RISC) microprocessor, very long instruction word (VLIW) microprocessor, processor implementing other instruction sets, or processors implementing a combination of instruction sets. Processing device 602 can also be one or more special-purpose processing devices such as an application specific integrated circuit (ASIC), a field programmable gate array (FPGA), a digital signal processor (DSP), network processor, or the like. In accordance with one or more aspects of the present disclosure, processing device 602 can be configured to execute instructions performing method 400 of implementing simulations-based testing for improving autonomous vehicle systems using retro-reflection data for real-world materials and method 500 of obtaining retro-reflection data for real-world materials that can be encountered in driving environments, for high-fidelity simulations of autonomous vehicles.

Example computer device 600 can further comprise a network interface device 608, which can be communicatively coupled to a network 620. Example computer device 600 can further comprise a video display 610 (e.g., a liquid crystal display (LCD), a touch screen, or a cathode ray tube (CRT)), an alphanumeric input device 612 (e.g., a keyboard), a cursor control device 614 (e.g., a mouse), and an acoustic signal generation device 616 (e.g., a speaker).

Data storage device 618 can include a computer-readable storage medium (or, more specifically, a non-transitory computer-readable storage medium) 628 on which is stored one or more sets of executable instructions 622. In accordance with one or more aspects of the present disclosure, executable instructions 622 can comprise executable instructions performing method 400 of implementing simulations-based testing for improving autonomous vehicle systems using retro-reflection data for real-world materials and method 500 of obtaining retro-reflection data for real-world materials that can be encountered in driving environments, for high-fidelity simulations of autonomous vehicles.

Executable instructions 622 can also reside, completely or at least partially, within main memory 604 and/or within processing device 602 during execution thereof by example computer device 600, main memory 604 and processing device 602 also constituting computer-readable storage media. Executable instructions 622 can further be transmitted or received over a network via network interface device 608.

While the computer-readable storage medium 628 is shown in FIG. 6 as a single medium, the term "computer-readable storage medium" should be taken to include a single medium or multiple media (e.g., a centralized or distributed database, and/or associated caches and servers) that store the one or more sets of VM operating instructions. The term "computer-readable storage medium" shall also be taken to include any medium that is capable of storing or encoding a set of instructions for execution by the machine that cause the machine to perform any one or more of the methods described herein. The term "computer-readable storage medium" shall accordingly be taken to include, but not be limited to, solid-state memories, and optical and magnetic media.

The following examples pertain to further implementations.

Example 1 is a method of generating, using a computing device, a simulation of an environment around an autonomous vehicle, wherein the simulation includes representations of one or more objects based on retro-reflectivity data collected using test sensors; generating a representation of the autonomous vehicle driving in the simulation; generating, based on the representations of the one or more objects, simulated reflection data for a first location associated with the representation of the autonomous vehicle at a first instance of time relative to the one or more objects; and adjusting the simulated reflection data based on a motion of the representation of the autonomous vehicle between the first location and a second location associated with the representation of the autonomous vehicle at a second instance of time relative to the one or more objects.

Example 2 is the method of Example 1, further comprising: transmitting the simulated reflection data to a system that provides instructions for driving the autonomous vehicle in the simulation, wherein the instructions define the motion of the representation of the autonomous vehicle between the first location and the second location relative to the one or more objects.

Example 3 is the method of Example 1, further comprising: providing a display of the one or more objects in the simulation based on the simulated reflection data; and altering the display of the one or more objects in the simulation based on the adjusted reflectivity data.

Example 4 is the method of Example 1, wherein adjusting the simulated reflection data comprises determining, based on the motion of the autonomous vehicle, modifications of distances from a simulated sensor on the representation of the autonomous vehicle to the one or more objects.

Example 5 is the method of Example 4, wherein adjusting the simulated reflection data further comprises determining modifications of angles of incidence of beams directed to the one or more objects from the simulated sensor on the representation of the autonomous vehicle.

Example 6 is the method of Example 4, wherein at least one of the test sensors is of a same type or a same model as the simulated sensor on the representation of the autonomous vehicle.

Example 7 is the method of Example 1, wherein at least one of the one or more objects is associated with a material type, and generating the simulated reflection data comprises accessing retro-reflectivity data for the material type.

Example 8 is a method comprising: initiating, by a computing device, a simulation of an environment of an autonomous driving vehicle, wherein the simulation comprises a plurality of simulated objects, each of the plurality of simulated objects having a description comprising an identification of a material type of a respective simulated object; accessing simulated reflection data, wherein the simulated reflection data is based on the plurality of simulated objects and retro-reflectivity data for one or more material types of the plurality of simulated objects; and determining, using an autonomous vehicle control system for an autonomous vehicle, a driving path relative to the plurality of simulated objects, wherein the driving path is based on the simulated reflection data.

Example 9 is the method of Example 8, wherein determining the driving path comprises receiving, by the autonomous vehicle control system from an object detection system, information about one or more identified objects of the plurality of simulated objects, wherein the information about the one or more identified objects is generated by the object detection system using the simulated reflection data.

Example 10 is the method of Example 9, further comprising: evaluating the driving path using one or more predetermined metrics; and modifying, based on the evaluation of the driving path, at least one of the autonomous vehicle control system or the object detection system.

Example 11 is the method of Example 10, wherein the one or more predetermined metrics comprise a minimum distance from the autonomous vehicle, traveling along the determined driving path, to one or more of the plurality of simulated objects.

Example 12 is the method of Example 10, wherein the one or more predetermined metrics comprise a missed object of the plurality of simulated objects, wherein a simulated object is missed if a retro-reflection intensity for the simulated object is below a threshold intensity.

Example 13 is the method of Example 8, wherein the description of each of the plurality of simulated objects further comprises one or more characteristics of a surface of the respective simulated object.

Example 14 is the method of Example 8, wherein the retro-reflectivity data was simulated for the one or more material types of the simulated objects using a measured intensity of a beam directed to a physical object made of a respective material of the one or more material types.

Example 15 is the method of Example 8, wherein the simulated reflection data comprises simulated strengths of beams retro-reflected from each of at least some of the plurality of simulated objects, wherein the simulated strengths of beams are based on a distance from the autonomous vehicle to the at least some of the plurality of simulated objects.

Example 16 is the method of Example 15, wherein the simulated strengths of the beams retro-reflected from a first subset of the plurality of simulated objects is generated based on measured retro-reflectivity values for each of the material types of the first subset of simulated objects.

Example 17 is the method of Example 16, wherein the simulated strengths of the beams retro-reflected from a second subset of the plurality of simulated objects is generated based on modeled retro-reflectivity values for each of the material types of the second subset of simulated objects.

Example 18 is a system comprising: a memory that stores instructions; and a computing device to execute the instructions from the memory to: initiate a simulation of an environment of an autonomous driving vehicle, wherein the simulation comprises a plurality of simulated objects, each of the plurality of simulated objects having a description comprising an identification of a material type of the respective simulated object; access simulated reflection data, wherein the simulated reflection data is based on the plurality of simulated objects and retro-reflectivity data for one or more material types of the plurality of simulated objects; and determine, using an autonomous vehicle control system for an autonomous vehicle, a driving path relative to the plurality of simulated objects, wherein the driving path is based on the simulated reflection data.

Example 19 is the system of Example 18, wherein to determine the driving path the computing device is to receive, using the autonomous vehicle control system, from an object detection system, information about one or more identified objects of the plurality of simulated objects, wherein the information about the one or more identified objects is generated by the object detection system using the simulated reflection data.

Example 20 is the system of Example 19, wherein the computing device is further to: evaluate the driving path using one or more predetermined metrics; and modify, based on the evaluation of the driving path, at least one of the autonomous vehicle control system or the object detection system.

Example 21 is the system of Example 20, wherein the one or more predetermined metrics comprise a minimum distance from the autonomous vehicle, traveling along the determined driving path, to one or more of the plurality of simulated objects.

Example 22 is the system of Example 20, wherein the one or more predetermined metrics comprise a missed object of the plurality of simulated objects, wherein a simulated object is missed if a retro-reflection intensity for the simulated object is below a threshold intensity.

Example 23 is the system of Example, wherein the description of each of the plurality of simulated objects further comprises one or more characteristics of a surface of the respective simulated object.

Example 24 is the system of Example 18, wherein the retro-reflectivity data was simulated for the one or more material types of the simulated objects using a measured intensity of a beam directed to a physical object made of a respective material of the one or more material types.

Example 25 is the system of Example 8, wherein the simulated reflection data comprises simulated strengths of beams retro-reflected from each of at least some of the plurality of simulated objects, wherein the simulated strengths of beams are based on a distance from the autonomous vehicle to the at least some of the plurality of simulated objects.

Example 26 is the system of Example 25, wherein the simulated strengths of the beams retro-reflected from a first subset of the plurality of simulated objects is generated based on measured retro-reflectivity values for each of the material types of the first subset of simulated objects.

Example 27 is the system of Example 26, wherein the simulated strengths of the beams retro-reflected from a second subset of the plurality of simulated objects is generated based on modeled retro-reflectivity values for each of the material types of the second subset of simulated objects.

In example 28, a system comprising: a memory that stores instructions; and a computing device to execute the instructions from the memory to: generate a simulation of an environment around an autonomous vehicle, wherein the simulation includes representations of one or more objects based on retro-reflectivity data collected using test sensors; generate a representation of the autonomous vehicle driving in the simulation; generate, based on the representations of the one or more objects, simulated reflection data for a first location associated with the representation of the autonomous vehicle at a first instance of time relative to the one or more objects; and adjust the simulated reflection data based on a motion of the representation of the autonomous vehicle between the first location and a second location associated with the representation of the autonomous vehicle at a second instance of time relative to the one or more objects.

Example 29 is the system of Example 28, wherein the computing device is further to: transmit the simulated reflection data to a system that provides instructions for driving the autonomous vehicle in the simulation, wherein the instructions define the motion of the representation of the autonomous vehicle between the first location and the second location relative to the one or more objects.

Example 30 is the system of Example 28, wherein the computing device is further to: provide a display of the one or more objects in the simulation based on the simulated reflection data; and alter the display of the one or more objects in the simulation based on the adjusted reflectivity data.

Example 31 is the system of Example 28, wherein to adjust the simulated reflection data the computing device is to determine, based on the motion of the autonomous vehicle, modifications of distances from a simulated sensor on the representation of the autonomous vehicle to the one or more objects.

Example 32 is the system of Example 31, wherein to adjust the simulated reflection data the computing device is further to determine modifications of angles of incidence of beams directed to the one or more objects from the simulated sensor on the representation of the autonomous vehicle.

Example 33 is the system of Example 31, wherein at least one of the test sensors is of a same type or a same model as the simulated sensor on the representation of the autonomous vehicle.

Example 34 is the system of Example 28, wherein at least one of the one or more objects is associated with a material type, and generating the simulated reflection data comprises accessing retro-reflectivity data for the material type.

Example 35 is a non-transitory computer-readable medium having instructions stored thereon that, when executed by a processing device, cause the computing device to: generate a simulation of an environment around an autonomous vehicle, wherein the simulation includes representations of one or more objects based on retro-reflectivity data collected using test sensors; generate a representation of the autonomous vehicle driving in the simulation; generate, based on the representations of the one or more objects, simulated reflection data for a first location associated with the representation of the autonomous vehicle at a first instance of time relative to the one or more objects; and adjust the simulated reflection data based on a motion of the representation of the autonomous vehicle between the first location and a second location associated with the representation of the autonomous vehicle at a second instance of time relative to the one or more objects.

Example 36 is the computer-readable medium of Example 35, wherein the instructions are further to cause the computing device to: transmit the simulated reflection data to a system that provides instructions for driving the autonomous vehicle in the simulation, wherein the instructions define the motion of the representation of the autonomous vehicle between the first location and the second location relative to the one or more objects.

Example 37 is the computer-readable medium of Example 35, wherein the instructions are further to cause the computing device to: provide a display of the one or more objects in the simulation based on the simulated reflection data; and alter the display of the one or more objects in the simulation based on the adjusted reflectivity data.

Example 38 is the computer-readable medium of Example 35, wherein to adjust the simulated reflection data the computing device it to determine, based on the motion of the autonomous vehicle, modifications of distances from a simulated sensor on the representation of the autonomous vehicle to the one or more objects.

Example 39 is the computer-readable medium of Example 38, wherein adjusting the simulated reflection data further comprises determining modifications of angles of incidence of beams directed to the one or more objects from the simulated sensor on the representation of the autonomous vehicle.

Example 40 is the computer-readable medium of Example 38, wherein at least one of the test sensors is of a same type or a same model as the simulated sensor on the representation of the autonomous vehicle.

Example 41 is the computer-readable medium of Example 35, wherein at least one of the one or more objects is associated with a material type, and generating the simulated reflection data comprises accessing retro-reflectivity data for the material type.

Example 42 is a non-transitory computer-readable medium having instructions stored thereon that, when executed by a computing device, cause the computing device to: initiate a simulation of an environment of an autonomous driving vehicle, wherein the simulation comprises a plurality of simulated objects, each of the plurality of simulated objects having a description comprising an identification of a material type of the respective simulated object; access simulated reflection data, wherein the simulated reflection data is based on the plurality of simulated objects and retro-reflectivity data for one or more material types of the plurality of simulated objects; and determine, using an autonomous vehicle control system for an autonomous vehicle, a driving path relative to the plurality of simulated objects, wherein the driving path is based on the simulated reflection data.

Example 43 is the computer-readable medium of Example 42, wherein to determine the driving path the computing device is to receive, using the autonomous vehicle control system, from an object detection system, information about one or more identified objects of the plurality of simulated objects, wherein the information about the one or more identified objects is generated by the object detection system using the simulated reflection data.

Example 44 is the computer-readable medium of Example 43, wherein the instructions are further to cause the computing device to: evaluate the driving path using one or more predetermined metrics; and modify, based on the evaluation of the driving path, at least one of the autonomous vehicle control system or the object detection system.

Example 45 is the computer-readable medium of Example 44, wherein the one or more predetermined metrics comprise a minimum distance from the autonomous vehicle, traveling along the determined driving path, to one or more of the plurality of simulated objects.

Example 46 is the computer-readable medium of Example 44, wherein the one or more predetermined metrics comprise a missed object of the plurality of simulated objects, wherein a simulated object is missed if a retro-reflection intensity for the simulated object is below a threshold intensity.

Example 47 is the computer-readable medium of Example 42, wherein the description of each of the plurality of simulated objects further comprises one or more characteristics of a surface of the respective simulated object.

Example 48 is the computer-readable medium of Example 42, wherein the retro-reflectivity data was simulated for the one or more material types of the simulated objects using a measured intensity of a beam directed to a physical object made of a respective material of the one or more material types.

Example 49 is the computer-readable medium of Example 48, wherein the simulated reflection data comprises simulated strengths of beams retro-reflected from each of at least some of the plurality of simulated objects, wherein the simulated strengths of beams are based on a distance from the autonomous vehicle to the at least some of the plurality of simulated objects.

Example 50 is the computer-readable medium of Example 49, wherein the simulated strengths of the beams retro-reflected from a first subset of the plurality of simulated objects is generated based on measured retro-reflectivity values for each of the material types of the first subset of simulated objects.

Example 51 is the computer-readable medium of Example 49, wherein the simulated strengths of the beams retro-reflected from a second subset of the plurality of simulated objects is generated based on modeled retro-reflectivity values for each of the material types of the second subset of simulated objects.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, as apparent from the following discussion, it is appreciated that throughout the description, discussions utilizing terms such as "identifying," "determining," "storing," "adjusting," "causing," "returning," "comparing," "creating," "stopping," "loading," "copying," "throwing," "replacing," "performing," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Examples of the present disclosure also relate to an apparatus for performing the methods described herein. This apparatus can be specially constructed for the required purposes, or it can be a general purpose computer system selectively programmed by a computer program stored in the computer system. Such a computer program can be stored in a computer readable storage medium, such as, but not limited to, any type of disk including optical disks, CD-ROMs, and magnetic-optical disks, read-only memories (ROMs), random access memories (RAMs), EPROMs, EEPROMs, magnetic disk storage media, optical storage media, flash memory devices, other type of machine-accessible storage media, or any type of media suitable for storing electronic instructions, each coupled to a computer system bus.

The methods and displays presented herein are not inherently related to any particular computer or other apparatus. Various general purpose systems can be used with programs in accordance with the teachings herein, or it may prove convenient to construct a more specialized apparatus to perform the required method steps. The required structure for a variety of these systems will appear as set forth in the description below. In addition, the scope of the present disclosure is not limited to any particular programming language. It will be appreciated that a variety of programming languages can be used to implement the teachings of the present disclosure.

It is to be understood that the above description is intended to be illustrative, and not restrictive. Many other implementation examples will be apparent to those of skill in the art upon reading and understanding the above description. Although the present disclosure describes specific examples, it will be recognized that the systems and methods of the present disclosure are not limited to the examples described herein, but can be practiced with modifications within the scope of the appended claims. Accordingly, the specification and drawings are to be regarded in an illustrative sense rather than a restrictive sense. The scope of the present disclosure should, therefore, be determined with reference to the appended claims, along with the full scope of equivalents to which such claims are entitled.

What is claimed is:

1. A method of using an artificial simulated environment to test an autonomous vehicle control software, the method comprising:
generating, using a computing device, an artificial simulated environment around an autonomous vehicle, wherein the artificial simulated environment includes representations of one or more simulated objects, the representations comprising surface retro-reflectivity characteristics of the one or more simulated objects, each of the one or more simulated objects associated with one or more materials, wherein the surface retro-reflectivity characteristics of an individual simulated object of the one or more simulated objects represent physical properties of the one or more materials associated with the individual simulated object;
generating a representation of the autonomous vehicle driving in the artificial simulated environment;
generating, based on the representations of the one or more simulated objects, simulated reflection data for a first location associated with the representation of the autonomous vehicle at a first instance of time relative to the one or more simulated objects;

causing the autonomous vehicle control software to determine a motion of the representation of the autonomous vehicle between the first location and a second location;

adjusting the simulated reflection data based on the determined motion of the representation of the autonomous vehicle between the first location and the second location associated with the representation of the autonomous vehicle at a second instance of time relative to the one or more simulated objects;

modifying the autonomous vehicle control software in view of the simulated reflection data, the determined motion of the representation of the autonomous vehicle, and the adjusted simulated reflection data; and using the modified autonomous vehicle control software to control a motion of a physical autonomous vehicle.

2. The method of claim 1, further comprising:
transmitting the simulated reflection data to a system that provides instructions for driving the autonomous vehicle in the artificial simulated environment, wherein the instructions define the motion of the representation of the autonomous vehicle between the first location and the second location relative to the one or more simulated objects.

3. The method of claim 1, further comprising:
providing a display of the one or more simulated objects based on the simulated reflection data; and
altering the display of the one or more simulated objects based on the adjusted reflection data.

4. The method of claim 1, wherein adjusting the simulated reflection data comprises determining, based on the motion, modifications of distances from a simulated sensor on the representation of the autonomous vehicle to the one or more simulated objects.

5. The method of claim 4, wherein adjusting the simulated reflection data further comprises determining modifications of angles of incidence of beams directed to the one or more simulated objects from the simulated sensor on the representation of the autonomous vehicle.

6. The method of claim 1, wherein the retro-reflectivity characteristics of an individual simulated object of the one or more simulated objects were measured, using test sensors, for the one or more materials associated with the individual simulated object.

7. A method comprising:
initiating, by a computing device, an artificial simulated environment of an autonomous driving vehicle, wherein the artificial simulated environment comprises a plurality of simulated objects, each of the plurality of simulated objects being associated with one or more materials;

generating simulated reflection data, wherein the simulated reflection data is based on retro-reflectivity data for the plurality of simulated objects, wherein the retro-reflectivity data of an individual simulated object of the plurality of simulated objects represent physical properties of one or more materials associated with the individual simulated object;

determining, using an autonomous vehicle control system for the autonomous driving vehicle, a driving path relative to the plurality of simulated objects, wherein the driving path is based on the simulated reflection data;

training, using the determined driving path, the autonomous vehicle control system; and using the autonomous vehicle control system to control motion of a physical autonomous vehicle.

8. The method of claim 7, wherein determining the driving path comprises receiving, by the autonomous vehicle control system from an object detection system, information about one or more identified objects of the plurality of simulated objects, wherein the information about the one or more identified objects is generated by the object detection system using the simulated reflection data.

9. The method of claim 8, further comprising:
evaluating the driving path using one or more predetermined metrics; and
modifying, based on the evaluation of the driving path, at least one of the autonomous vehicle control system or the object detection system.

10. The method of claim 9, wherein the one or more predetermined metrics comprise a minimum distance from the autonomous vehicle, travelling along the determined driving path, to one or more of the plurality of simulated objects.

11. The method of claim 9, wherein the one or more predetermined metrics comprise a missed object of the plurality of simulated objects, wherein a simulated object is missed if a retro-reflection intensity for the simulated object is below a threshold intensity.

12. The method of claim 7, wherein the retro-reflectivity data was simulated for the one or more materials of the simulated objects using a measured intensity of a beam directed to a physical object made of a respective material.

13. The method of claim 7, wherein the simulated reflection data comprises simulated strengths of beams retro-reflected from each of at least some of the plurality of simulated objects, wherein the simulated strengths of beams are based on a distance from the autonomous vehicle to the at least some of the plurality of simulated objects.

14. The method of claim 13, wherein the simulated strengths of the beams retro-reflected from a first subset of the plurality of simulated objects is generated based on measured retro-reflectivity values for each of the one or more materials of the first subset of simulated objects.

15. The method of claim 14, wherein the simulated strengths of the beams retro-reflected from a second subset of the plurality of simulated objects is generated based on modeled retro-reflectivity values for each of the one or more materials of the second subset of simulated objects.

16. A system comprising:
a memory that stores instructions; and
a computing device to execute the instructions from the memory to:
initiate an artificial simulated environment of an autonomous vehicle, wherein the artificial simulated environment comprises a plurality of simulated objects, each of the plurality of simulated objects being associated with one or more materials;
generate simulated reflection data, wherein the simulated reflection data is based on retro reflectivity data for the plurality of simulated objects wherein the retro-reflectivity data of an individual simulated object of the plurality of simulated objects are obtained represent physical properties of one or more materials associated with the individual simulated object;
determine, using an autonomous vehicle control system for the autonomous vehicle, a driving path relative to the plurality of simulated objects, wherein the driving path is based on the simulated reflection data;
train, using the determined driving path, the autonomous vehicle control system; and use the autonomous vehicle control system to control motion of a physical autonomous vehicle.

17. The system of claim 16, wherein to determine the driving path the computing device is to receive, using the autonomous vehicle control system, from an object detection system, information about one or more identified objects of the plurality of simulated objects, wherein the information about the one or more identified objects is generated by the object detection system using the simulated reflection data.

18. The system of claim 17, wherein to train the autonomous vehicle control system, the computing device is to:
evaluate the determined driving path using one or more predetermined metrics; and
modify, based on the evaluation of the determined driving path, at least one of the autonomous vehicle control system or the object detection system.

* * * * *